US012750065B2

(12) United States Patent
Hirai et al.

(10) Patent No.: US 12,750,065 B2
(45) Date of Patent: Sep. 29, 2026

(54) SUCCESSIVE-APPROXIMATION ANALOG-TO-DIGITAL CONVERTER

(71) Applicant: MegaChips Corporation, Osaka (JP)

(72) Inventors: Kazuhisa Hirai, Osaka (JP); Shingo Adachi, Osaka (JP)

(73) Assignee: MegaChips Corporation, Osaka (JP)

( * ) Notice: Subject to any disclaimer, the term of this patent is extended or adjusted under 35 U.S.C. 154(b) by 123 days.

(21) Appl. No.: 18/978,627

(22) Filed: Dec. 12, 2024

(65) Prior Publication Data

US 2025/0274137 A1 Aug. 28, 2025

(30) Foreign Application Priority Data

Feb. 27, 2024 (JP) ................................ 2024-027488

(51) Int. Cl.
*H03M 1/12* (2006.01)
*H03M 1/40* (2006.01)
(Continued)

(52) U.S. Cl.
CPC .......... *H03M 1/466* (2013.01); *H03M 1/403* (2013.01); *H03M 3/384* (2013.01)

(58) Field of Classification Search
CPC .......... H03M 1/466; H03M 1/38; H03M 1/46; H03M 1/403; H03M 1/442
(Continued)

(56) References Cited

U.S. PATENT DOCUMENTS 7,379,012 B2 5/2008 Sutardja
7,439,896 B2 10/2008 Sutardja
(Continued)

FOREIGN PATENT DOCUMENTS

JP 2007-074706 A 3/2007

OTHER PUBLICATIONS

Mojitaba Bagheri et al.; "A Mismatch Calibration Technique for SAR ADCs Based on Deterministic Self-Calibration and Stochastic Quantization", IEEE, Transactions on Circuits and System—I: Regular Papers, vol. 67, No. 9, Sep. 2020, pp. 2883-2896 (14 pages).

*Primary Examiner* — Peguy Jean Pierre
(74) *Attorney, Agent, or Firm* — Osha Bergman Watanabe & Burton LLP

(57) ABSTRACT

The present invention aims to suppress an increase in the size of a circuit configuration and achieve speed-up. The present invention is a successive-approximation ADC including: a CDAC consisting of a main capacitor bank consisting of a plurality of first capacitors and an auxiliary capacitor bank including a plurality of second capacitors to supply a corrected capacitance value to the first capacitors, a comparator configured to output a bit signal based on a capacitance redistribution signal output according to capacitance redistribution by the CDAC in response to an analog input signal, a logic circuit configured to output a digital output signal based on the bit signal, and a corrected capacitance value designation circuit configured to output a correction designation value that designates a corrected capacitance value to be supplied to the first capacitors. The corrected capacitance value designation circuit holds in advance two correction designation values before 1 bit as pre-correction designation values, selects one of the pre-correction designation values according to the bit signal from the comparator, and calculates two most recent correction designation values based on the bit signal.

19 Claims, 17 Drawing Sheets

(51) Int. Cl.
*H03M 1/46* (2006.01)
*H03M 3/00* (2006.01)

(58) Field of Classification Search
USPC ................................. 341/172, 120, 118, 155
See application file for complete search history.

(56) References Cited

U.S. PATENT DOCUMENTS

| | | | | |
|---|---|---|---|---|
| 7,443,329 | B2 | 10/2008 | Sutardja | |
| 8,482,446 | B2 * | 7/2013 | Haneda | H03M 1/1019 341/163 |
| 8,941,529 | B2 | 1/2015 | Sutardja | |
| 10,038,453 | B1 * | 7/2018 | George | H03M 1/804 |
| 2007/0052566 | A1 | 3/2007 | Sutardja | |
| 2007/0052567 | A1 | 3/2007 | Sutardja | |
| 2007/0052574 | A1 | 3/2007 | Sutardja | |
| 2008/0211706 | A1 | 9/2008 | Sutardja | |
| 2011/0215956 | A1 * | 9/2011 | Ishikawa | H03M 1/00 341/110 |
| 2020/0373937 | A1 * | 11/2020 | Audebert | H03M 1/808 |

* cited by examiner

Calibration for Cm<n-2>

Cm**: CAPACITOR OF Main CDAC

Ca**: CAPACITOR OF Aux CDAC

Cex : UNUSED CAPACITOR of Aux CDAC

α : DIFFERENCE VALUE FROM IDEAL CAPACITANCE VALUE (a) (b)

SUCCESSIVE-APPROXIMATION ANALOG-TO-DIGITAL CONVERTER

TECHNICAL FIELD

The present invention relates to a successive-approximation analog-to-digital converter.

BACKGROUND ART

A circuit that uses a successive approximation register (SAR) to convert an input analog signal into a digital signal and output the digital signal is called a successive-approximation analog-to-digital converter (hereinafter, referred to as "successive-approximation ADC" or "SAR ADC"). Further, a successive-approximation ADC that includes a capacitive digital-to-analog converter (CDAC) using a capacitor bank for the analog signal input is known as a successive-approximation ADC using a capacitive or capacitance redistribution method. For example, Patent Document 1 discloses such a successive-approximation ADC using a capacitance redistribution method.

In a successive-approximation ADC using a capacitance redistribution method, correction (calibration) is performed to remove the effects of manufacturing variations in each capacitor of the CDAC. For example, Non-Patent Document 1 discloses a calibration technology for a CDAC.

CITATION LIST

Patent Literature

Patent Document 1: JP 2007-074706

Non Patent Literature

Non-Patent Document 1: Mojitaba Bagheri et al., "A Mismatch Calibration Technique for SAR ADCs Based on Deterministic Self-Calibration and Stochastic Quantization", IEEE, TRANSACTIONS ON CIRCUITS AND SYSTEM-I: REGULAR PAPERS, Vol. 67, No. 9, pp. 2883-2896 September 2020

SUMMARY OF INVENTION

Technical Problem

The CDAC in a conventional successive-approximation ADC includes an auxiliary capacitor bank for correction and a circuit to control the auxiliary capacitor bank, in addition to a main capacitor bank. As a result of the correction, the corrected value (capacitance value) by the auxiliary capacitor bank is added to each bit indicated by the main capacitor bank. Thus, as the number of corresponding bits increases, the circuit configuration becomes more complex and larger, and the operating speed decreases.

Therefore, an object of the present invention is to provide a new correction architecture for the CDAC of a successive-approximation ADC.

More specifically, an object of the present invention is to provide a successive-approximation ADC that is capable of suppressing the increase in the size of the circuit configuration and speed up the operation even when the number of supported bits increases.

It is also an object of the present invention to provide a technology to improve the accuracy of correction for the CDAC.

It is also an object of the present invention to provide a technology that does not deteriorate the dynamic range of a successive-approximation ADC by correction to the CDAC.

Solution to Problem

The present invention for solving the above-mentioned problems includes the following invention specific matters and technical features.

The present invention according to one aspect is a successive-approximation analog-to-digital converter using a capacitance redistribution method. The successive-approximation analog-to-digital converter includes an ADC control circuit, and an ADC body circuit configured to convert an input analog input signal into a digital output signal and output the converted signal (i.e., digital output signal) under control of the ADC control circuit. The ADC body circuit includes a CDAC that includes a main capacitor bank composed of a plurality of first capacitors connected in parallel and an auxiliary capacitor bank composed of a plurality of second capacitors connected in parallel. The auxiliary capacitor bank connected to supply a corrected capacitance value for any of the plurality of first capacitors in the main capacitor bank. The ADC body circuit further includes a comparator configured to output a bit signal based on a capacitance redistribution signal output according to capacitance redistribution by the CDAC in response to the analog input signal, a logic circuit configured to output the digital output signal in a predetermined format based on the bit signal output from the comparator, and a corrected capacitance value designation circuit configured to output a correction designation value to designate a corrected capacitance value to be supplied to the first capacitors in the main capacitor bank. The corrected capacitance value designation circuit holds in advance at least two correction designation values at least one bit earlier in time as pre-correction designation values, selects one of the pre-correction designation values according to the bit signal fed back from the comparator, and calculates two latest correction designation values based on one of the selected pre-correction designation values.

The CDAC may control the corrected capacitance value to be supplied to the first capacitors based on one of the two correction designation values.

In addition, the ADC body circuit may include a multiplexer that selects one of the two correction designation values according to the bit signal fed back from the comparator. The multiplexer may be configured as part of the CDAC.

In addition, the CDAC may control a connection configuration of the second capacitor to supply the corrected capacitance value to the first capacitors based on one of the two correction designation values.

The successive-approximation analog-to-digital converter may further include an offset correction control circuit configured to control execution of offset correction for the comparator, and an offset correction circuit configured to, under control of the offset correction control circuit, supply an offset corrected value to the comparator.

In addition, the offset correction control circuit may control the offset correction circuit to increase or decrease an output current value for the comparator. Further, the offset correction control circuit may specify the output current value, as the offset corrected value, at a point in time when the bit signal output from the comparator changes due to an increase or decrease in the output current value.

In addition, the comparator may include an analog comparator that outputs a comparison result signal based on the capacitance redistribution signal and a latch circuit that outputs the bit signal based on the comparison result signal output from the analog comparator.

The offset correction circuit may supply the offset corrected value for the comparison result signal.

The ADC control circuit may control the ADC body circuit to operate in one of correction mode and normal mode. In the correction mode, the ADC control circuit may specify the corrected capacitance value to be supplied from the auxiliary capacitor bank to a first capacitor to be corrected based on the bit signal output from the comparator by executing linearity correction for the CDAC to output a target digital output signal based on the first capacitor to be corrected corresponding to a predetermined bit. In the normal mode, the ADC control circuit may supply the specified corrected capacitance value to the first capacitor to be corrected from some of the second capacitors according to the correction designation value based on the bit signal output from the comparator.

In addition, the ADC control circuit may increase or decrease a capacitance value supplied from the auxiliary capacitor bank by changing the correction designation value in a stepwise or gradual manner, and specify the capacitance value, as the corrected capacitance value for the first capacitor to be corrected, when the bit signal output from the comparator changes.

In addition, the CDAC may supply the capacitance value based on some of the plurality of second capacitors to the first capacitor to be corrected, according to the correction designation value.

In addition, the ADC control circuit may connect the first capacitor to be corrected to a first reference voltage and connect the first capacitors other than the first capacitor to be corrected to a second reference voltage. In such a configuration, the ADC control circuit may control the CDAC to supply the capacitance value based on some of the plurality of second capacitors connected to the first reference voltage to the first capacitor to be corrected.

In addition, the ADC control circuit may control a connection configuration of the second capacitor so that, in the normal mode, a capacitance value of the second capacitor that has not been used for supplying the specified corrected capacitance value to the first capacitor to be corrected is distributed to each of the first reference voltage and the second reference voltage.

In addition, in the correction mode, the ADC control circuit may execute offset correction for the comparator and then execute the linearity correction. In addition, the auxiliary capacitor bank may include a split capacitor for dividing the plurality of second capacitors into predetermined upper bits and predetermined lower bits.

In addition, the corrected capacitance value designation circuit may be configured to hold p^2 correction designation values (where p is an integer of two or more) before p bits as pre-correction designation values, and one of two pre-correction designation values before one bit may be selected as the recent correction designation value based on the bit signal.

In addition, the present invention according to another aspect is a method for operating a successive-approximation analog-to-digital converter that converts an input analog input signal into a digital output signal and outputs the converted signal. The method for operating includes outputting a capacitance redistribution signal in response to the analog input signal according to capacitance redistribution by a CDAC, outputting a bit signal by a comparator in response to the capacitance redistribution signal, and outputting the digital output signal in a predetermined format based on the bit signal. Here, the outputting the capacitance redistribution signal includes outputting a correction designation value that designates a corrected capacitance value to be supplied to a plurality of first capacitors connected in parallel in a main capacitor bank of the CDAC, and performing control to supply the corrected capacitance value designated by the correction designation value for any of the plurality of first capacitors from a plurality of second capacitors connected in parallel in an auxiliary capacitor bank of the CDAC. The outputting the correction designation value includes holding in advance at least the two correction designation values at least 1 bit earlier in time as pre-correction designation values, selecting one of the pre-correction designation values according to the bit signal fed back from the comparator, and calculating the two most recent correction designation values based on one of the selected pre-correction designation values.

In addition, the method for operating further includes executing linearity correction to specify the corrected capacitance value to be supplied from the auxiliary capacitor bank to the first capacitor to be corrected based on the bit signal output from the comparator so that a target digital output signal is output based on the first capacitor to be corrected corresponding to a predetermined bit.

In addition, the executing the linearity correction includes increasing or decreasing the capacitance value supplied by the auxiliary capacitor bank by changing the correction designation value in a stepwise or gradual manner, and specifying the capacitance value when the bit signal output from the comparator changes in response to an increase or a decrease in the capacitance value as the corrected capacitance value for the first capacitor to be corrected.

In the present specification and others, "means" does not simply mean physical means, but also includes cases where the functions possessed by the means are realized by software. Further, the functions of one means may be realized by two or more physical means, or the functions of two or more means may be realized by one physical means. In addition, a "system" refers to a logical collection of a plurality of devices (or functional modules that realize a specific function), regardless of whether or not each device or functional module is located within a single enclosure.

Advantageous Effects of Invention

The present invention provides a new correction architecture for the CDAC of a successive-approximation ADC. Among others, the present invention provides a successive-approximation ADC that helps to suppress the increase in the size of the circuit configuration and speed up the operation, even when the number of supported bits increases.

In addition, the present invention will also improve the accuracy of the correction for the CDAC.

Further, the present invention makes it possible to suppress the degradation of the dynamic range of the successive-approximation ADC by correction for the CDAC.

Other technical features, objects, effects, and advantages of the present invention will be made clear by the following embodiments described with reference to the accompanying drawings. The effects described in the present specification are examples only and are not limited, and other effects may be present.

DESCRIPTION OF EMBODIMENTS

Figure 1:
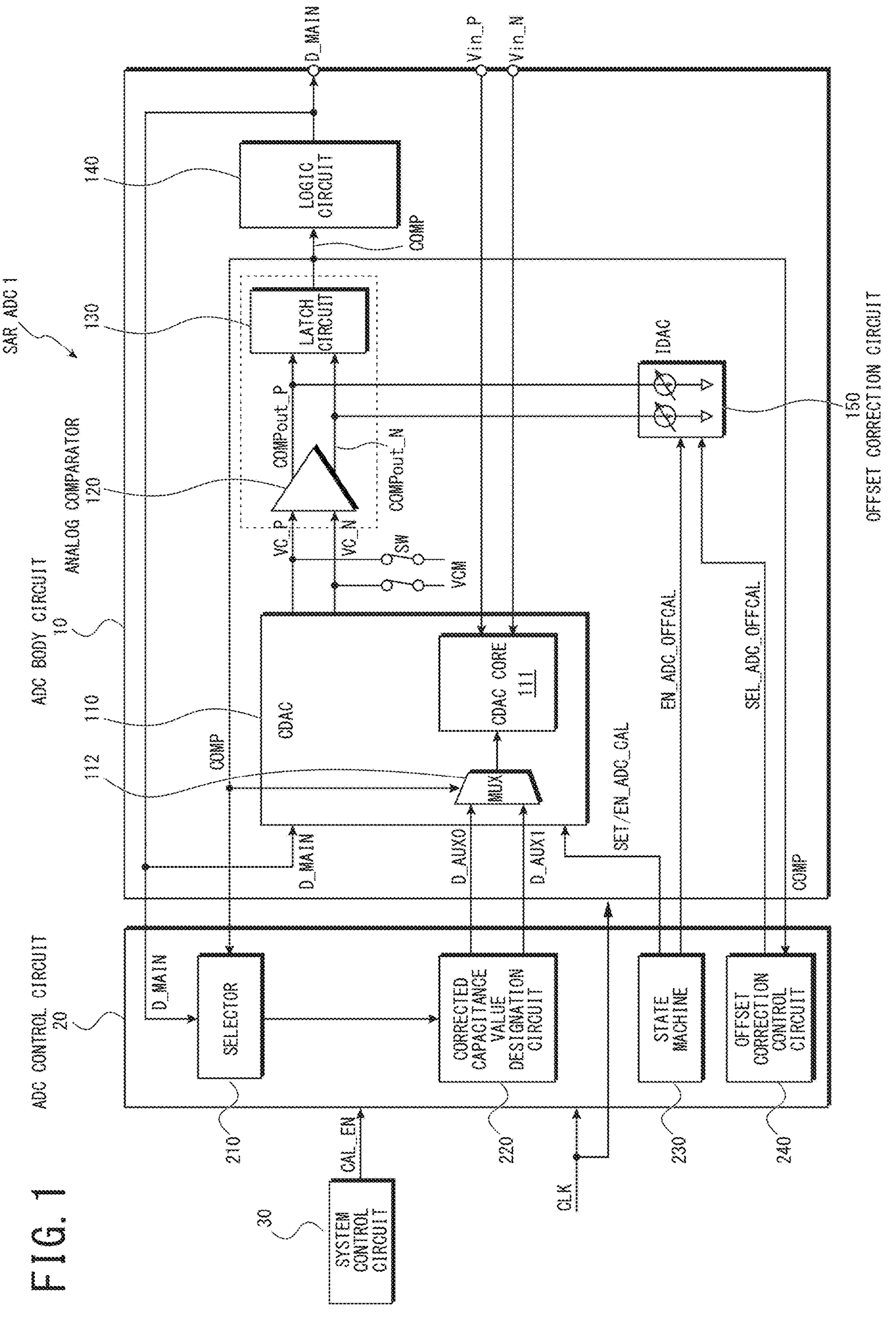
FIG. 1 is a diagram illustrating an example of a functional model of a successive-approximation ADC according to a first embodiment of the present invention.

Embodiments of the present invention will be described below with reference to the drawings. However, the embodiments described below are merely examples, and are not intended to exclude the application of various modifications or technologies not explicitly described below. The present invention may be implemented with various modifications (for example, by combining the embodiments and the like) without departing from the scope thereof. In addition, in the following description of the drawings, the same or similar parts are denoted by the same or similar reference numerals. The drawings are schematic and do not necessarily correspond to actual dimensions, ratios, or the like. The drawings may also include parts that differ in dimensional relationships and ratios.

First Embodiment

The present embodiment may be characterized in that, in a successive-approximation ADC, when outputting a digital output signal for an analog input signal based on the comparison result depending on capacitance redistribution of the capacitors corresponding to the digital code, the two correction designation values for the capacitor obtained at 1 bit earlier in time are held, and based on the comparison result, one of the two correction designation values is selected to generate the recent two correction designation values, which are then supplied to the capacitor to correct the capacitance value of the capacitor.

(Example of Overall Configuration)

FIG. 1 is a diagram illustrating an example of a functional model of a successive-approximation ADC according to a first embodiment of the present invention. As illustrated in FIG. 1, the successive-approximation ADC 1 in the present embodiment includes, for example, an ADC body circuit 10 and an ADC control circuit 20. A successive-approximation ADC 1 is controlled by a system control circuit 30, for example. The ADC body circuit 10 is able to operate at a higher supply voltage than the supply voltage of the ADC control circuit 20 and the system control circuit 30, and may typically, but not exclusively, consist of a separate block from the ADC control circuit 20 and the system control circuit 30 blocks.

The ADC body circuit 10 is a circuit that converts an input analog signal into a digital signal by using a capacitive successive-approximation register (i.e., capacitor bank) and outputs the signal. In this example, the ADC body circuit 10 is configured to output a digital output signal D_MAIN based on differential analog input signals Vin_P and Vin_N. The digital output signal D_MAIN may be in serial or parallel format, but in the present disclosure, is assumed to be in parallel format.

More specifically, the ADC body circuit 10 includes, for example, a capacitive digital-to-analog converter ("CDAC") 110, an analog comparator 120, a latch circuit 130, and a logic circuit 140. In the present disclosure, the ADC body circuit 10 further includes an offset correction circuit 150.

The CDAC 110 is a capacitive digital-to-analog converter using a capacitor bank. The CDAC 110 includes, for example, a CDAC core 111 consisting of capacitor banks and a multiplexer 112 for selecting the appropriate correction designation value to be output to the capacitor banks of the CDAC core 111. The multiplexer 112 may be configured separately from CDAC 110. The CDAC core 111 compares the differential voltage of the differential analog input signals Vin_P and Vin_N with the voltage (capacitance value) due to capacitance redistribution of the capacitor bank corresponding to the digital code, and outputs differential capacitance redistribution signals VC_P and VC_N in analog form according to the result of the comparison. The CDAC core 111 includes auxiliary capacitor banks (see FIG. 2) used to correct manufacturing variations in the capacitor banks. In the present disclosure, the former may be referred to as a main capacitor bank and the latter may be referred to as an auxiliary capacitor bank. The specific configuration of the CDAC core 111 and the correction method thereof are described below. During the linearity correction execution described below, a switch SW_VCM is controlled so that the differential capacitance redistribution signals VC_P and VC_N are forcibly set to a common voltage VCM.

The analog comparator 120 is a circuit that compares the respective voltages of the differential capacitance redistribution signals VC_P and VC_N output from the CDAC 110 with a predetermined comparison reference voltage (not shown) and outputs differential comparison result signals COMPout_P and COMPout_N according to the result of comparison. The analog comparator 120 may preferably be set to a low gain to prevent kickback noise caused by device operation, and the like from propagating to the input side. In the present disclosure, the analog comparator 120 is offset corrected by using the offset correction circuit 150 to improve the accuracy of the linearity correction for the CDAC 110.

The latch circuit 130 is a circuit that outputs bit signals according to the state (value) of the input signal. The latch circuit 130 functions as a comparator in cooperation with the analog comparator 120. Specifically, the latch circuit 130 sequentially outputs comparison result signals COMP, which designate logical values corresponding to the differential comparison result signals COMPout_P and COMPout_N, according to clock timing of a predetermined clock signal CLK. For example, the latch circuit 130 outputs a logic value "1" when the difference voltage between the differential comparison result signals COMPout_P and COMPout_N is greater than a predetermined reference voltage VREF, whereas the latch circuit 130 outputs a logical value "0" when the difference voltage is less than the predetermined reference voltage VREF. The latch circuit 130 may preferably be set to a high gain, in contrast to the analog comparator 120.

The logic circuit 140 outputs predetermined digital signals based on bit signals input from the latch circuit 130. Specifically, the logic circuit 140 performs serial-to-parallel conversion by mapping one bit of the comparison result signal COMP in serial, output from the latch circuit 130, to a code bit in parallel format in sequence, and is able to output the N bit parallel digital code as the digital signal D_MAIN at a predetermined timing. Further, the logic circuit 140 may be control the CDAC 110 and the ADC control circuit 20 based on the input comparison result signal COMP. In other words, each of the CDAC 110 and the ADC control circuit 20 is controlled according to the digital signal D_MAIN.

The offset correction circuit 150 is a circuit for performing offset correction for the analog comparator 120. Here, offset correction refers to correcting the offset of the output as a comparator, including the latch circuit 130, by changing the current value superimposed on the comparison result signal COMP in a stepwise or gradual manner until the state of the comparison result signal COMP is inverted when the potential difference between the differential comparison input signals (i.e., differential capacitance redistribution signals VC_P and VC_N) of the analog comparator 120 is set to "0." In other words, since the output voltage of the analog comparator 120 determines the output logic of the latch circuit 130, the offset correction circuit 150 offset-corrects the output voltage of the analog comparator 120 so that the threshold of the output logic of the latch circuit 130 is set accurately.

The offset correction circuit 150 includes, for example, a current output DA converter (IDAC) consisting of a sink-type current source. Under the control of an offset correction control circuit 240 described below, the offset correction circuit 150 adjusts each of the output current values of the IDACs variably so that the difference between differential comparison result signals COMPout_P and COMPout_N approaches "0" when the difference between the differential comparison result signals COMPout_P and COMPout_N output from the analog comparator 120 is set to 0, and holds the output current value when the difference between differential comparison result signals COMPout_P and COMPout_N becomes "0" or substantially "0" as the offset corrected value. Offset correction for the analog comparator 120 is performed prior to correction (calibration) for the CDAC 110. In the present disclosure, the offset correction circuit 150 is configured as part of the ADC body circuit 10, but may also be configured as part of the ADC control circuit 20. Details of the offset correction by the offset correction circuit 150 are described below.

The ADC control circuit 20 is a circuit that controls the operation of the ADC body circuit 10. The ADC control circuit 20 may be configured in whole or in part as a programmable device. Under the control of the system control circuit 30, the ADC body circuit 10 executes linearity correction (calibration) in correction mode to remove the effects of manufacturing variations in the capacitor banks of the CDAC 110. On the other hand, the ADC control circuit 20 outputs, in normal mode, the correction designation value obtained in correction mode to the ADC body circuit 10. Two correction designation values are prepared, and one of the values is selected according to the value of the comparison result signal COMP. Typically, the ADC control circuit 20 executes offset correction of the analog comparator 120 prior to executing linearity correction of the CDAC 110.

The ADC control circuit 20 may immediately control the CDAC 110 to execute linearity correction if offset correction of the analog comparator 120 has already been executed. The ADC control circuit 20 includes, for example, a selector 210, a corrected capacitance value designation circuit 220, a state machine 230, and an offset correction control circuit 240.

The selector 210 is a circuit for selectively controlling the operation of the corrected capacitance value designation circuit 220 according to the output from the logic circuit 140. Specifically, the selector 210 outputs a selector signal to the multiplexer 222 (see FIG. 4) in the corrected capacitance value designation circuit 220 for selecting an appropriate correction designation value according to a digital output signal D_MAIN output from the logic circuit 140.

The corrected capacitance value designation circuit 220 is a circuit for outputting the correction designation value obtained by executing linearity correction for the CDAC 110. The CDAC 110 supplies a corrected value (corrected capacitance value) for a capacitor Cm in a main capacitor bank 111*a* by a capacitor Ca in an auxiliary capacitor bank 111*b* according to a given correction designation value.

Details of the configuration of the corrected capacitance value designation circuit 220 are described below.

The state machine 230 is a circuit for controlling the operating state of the ADC body circuit 10.

Specifically, under the control of the system control circuit 30, the state machine 230 controls whether the CDAC 110 is operated in correction mode for executing correction (calibration) or in normal mode for actual operation. In correction mode, the state machine 230 controls the offset correction circuit 150 to execute offset correction prior to linearity correction. If offset correction has already been executed in the past, offset correction may be omitted.

The offset correction control circuit 240 controls the offset correction to the output voltage of the analog comparator 120 by controlling the output current value of IDAC of the offset correction circuit 150 to be changed in a stepwise or gradual manner. That is, the offset correction control circuit 240 adjusts the output current values of the IDACs in a gradual manner, each in response to the value of the digital output signal D_MAIN output from the latch circuit 130 in order to correct the offset including the latch if the difference between the differential capacitance redistribution signals VC_P and VC_N output from the analog comparator 120 is set to 0. The offset correction control circuit 240 sets the minimum offset value as the output current value when the value of the comparison result signal COMP output from the latch circuit 130 is inverted, and stores the corrected value. By this way, since the output voltage of the analog comparator 120 is offset corrected, the output logic threshold of the latch circuit 130 is set accurately.

The system control circuit 30 is a higher-level circuit for overall control of the operation of the successive-approximation ADC 1. For example, the system control circuit 30 controls the successive-approximation ADC 1 to be executed in correction mode or normal mode. Specifically, in correction mode, the system control circuit 30 outputs a correction enable signal CAL_EN and controls the ADC control circuit 20 to execute the correction processing for the CDAC 110. In response to this, the ADC control circuit 20 executes offset correction of the analog comparator 120 prior to executing linearity correction in the correction processing, and then executes linearity correction of the CDAC core 111. In normal mode, the system control circuit 30 controls the ADC control circuit 20 so that the capacitor Ca of the CDAC 110 is corrected with the corrected value determined by the linearity correction.

In the following description, various differential signals (e.g., "differential analog input signals Vin_P and Vin_N", and the like) as described above may be referred to as "differential analog input signals Vin", and the like, for simplification, if the differential signals may be treated as the same except for different polarity.

(Example of CDAC Circuit Configuration)

Figure 2:
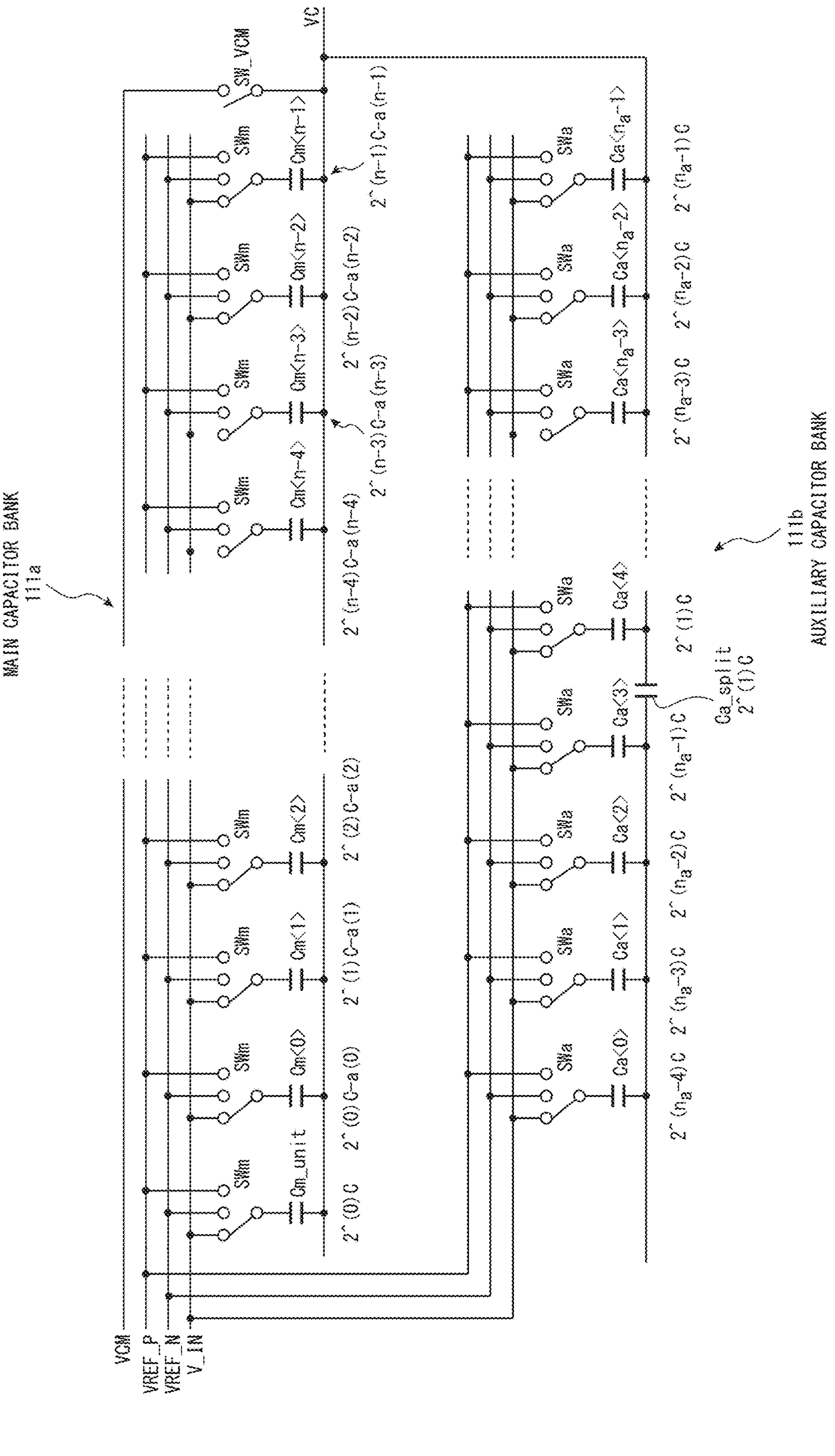
FIG. 2 is a diagram illustrating an example of a circuit configuration of a CDAC core in the successive-approximation ADC according to the first embodiment of the present invention.

FIG. 2 is a diagram illustrating an example of a circuit configuration of a CDAC core in the successive-approximation ADC according to the first embodiment of the present invention. As illustrated in FIG. 2, the CDAC core 111 includes the main capacitor bank 111*a* and the auxiliary capacitor bank 111*b*. FIG. 2 illustrates one of the capacitor banks corresponding to the different polarities of the CDAC core 111.

The main capacitor bank 111*a* consists of a plurality of first capacitors ("capacitors Cm") connected in parallel in an array, and the auxiliary capacitor bank 111*b* consists of a plurality of second capacitors ("capacitors Ca") connected in parallel in array. In the present example, the main capacitor bank 111*a* consists of n−1 capacitors Cm (i.e., capacitors Cm<n−1> to Cm<0>, sometimes referred to as "Cm<n−1:0>") and capacitors Cm_unit so that n-bit digital codes (n is any integer) are output. Here, the capacitor Cm<n−1> corresponds to MSB, and the capacitor Cm<0> corresponds to LSB of the digital code. Further, the capacitor Cm_unit is a capacitor to ensure a minimum base capacitance value. The capacitance value of the capacitor Cm_unit is set to 2^0×C, for example.

The capacitance value of each capacitor Cm<x> is ideally a binary weighted 2^x×C (where C is a constant indicating any capacitance value). Therefore, the capacitance value of the capacitor Cm<n−1> corresponding to MSB is maximum at the capacitor Cm. In the present disclosure, the capacitance value of each of some of the capacitors Cm are set to a negative value obtained by subtracting a predetermined capacitance value from such an ideal value (nominal value). As described below, in linearity correction, the shortage of the ideal value minus a predetermined capacitance value is supplemented by the capacitance value of the auxiliary capacitor bank 111*b*. The predetermined capacitance value to be subtracted from the ideal value in each capacitor Cm<x> can be suitably specified in relation to the capacitance value of the entire auxiliary capacitor bank 111*b*, considering the range of capacitance values that can be corrected. That is, the capacitance value of the capacitor Cm<n−1> corresponding to MSB of the main capacitor bank 111*a* should originally have a nominal value of 2^(n−1)× C, but a predetermined capacitance value a(n−1) is subtracted to enable correction to the negative side, for example, for example, 2^(n−1)×C−a(n−1).

A switch SWm is connected in series to each capacitor Cm so that a specific voltage is selectively applied to each capacitor Cm, depending on the operating state of the CDAC 110. Each switch SWm is independently controlled. For example, by controlling the opening and closing of each switch SWm, some of the capacitors Cm is connected to either a first reference voltage (e.g., reference voltage VREF_P) or a second reference voltage (e.g., reference voltage VREF_N) whose polarity is different from the polarity of the first reference voltage, and the remaining capacitor Cm can be complementarily connected to the second reference voltage or the first reference voltage. Further, the switch SW_VCM is used to forcibly set a capacitance redistribution signal VC (see FIG. 2) to a common voltage VCM.

The auxiliary capacitor bank 111*b* supplies a capacitance value to make each capacitor Cm in the main capacitor bank 111*a* an ideal value or close to the ideal value. The auxiliary capacitor bank 111*b*, for example, is composed of capacitors Ca<0> to Ca<$n_a$−1> of $n_a$ bits ($n_a$ is any integer). In the present example, the capacitance value of the capacitor Ca is set to 2^($n_a$−1)× C, at Ca<3>. Further, the auxiliary capacitor bank 111*b* also includes a split capacitor Ca_split inserted at any position of the parallel-connected capacitors Ca, whereby the capacitors Ca<0> to Ca<$n_a$−1> are divided into upper a bits and lower b bits (a+b=$n_a$). Thus, the split capacitor Ca_split is inserted between the upper a bits and the lower b bits to improve the efficiency of circuit area and power while expressing a relatively small capacitance value, allowing for higher bit resolution in linearity correction. In the present example, the capacitance value of the split capacitor Ca_split is 2^(1)×C. Therefore, in the configuration illustrated in the figure, the capacitance value of the capacitor Ca<0> can be expressed up to ⅛ compared to the capacitance value of the capacitor Ca<3>.

Each capacitor Ca is connected to a switch SWa so that a specific voltage is selectively applied depending on the operating state of the CDAC 110. Each switch SWa is controlled independently. For example, by controlling the opening and closing of each switch SWa, some of the capacitors Ca are connected to either the first reference voltage or the second reference voltage, and the remaining capacitors Ca can be complementarily connected to either the second reference voltage or the first reference voltage.

(Basic Concept of Linearity Correction)

Figure 3:
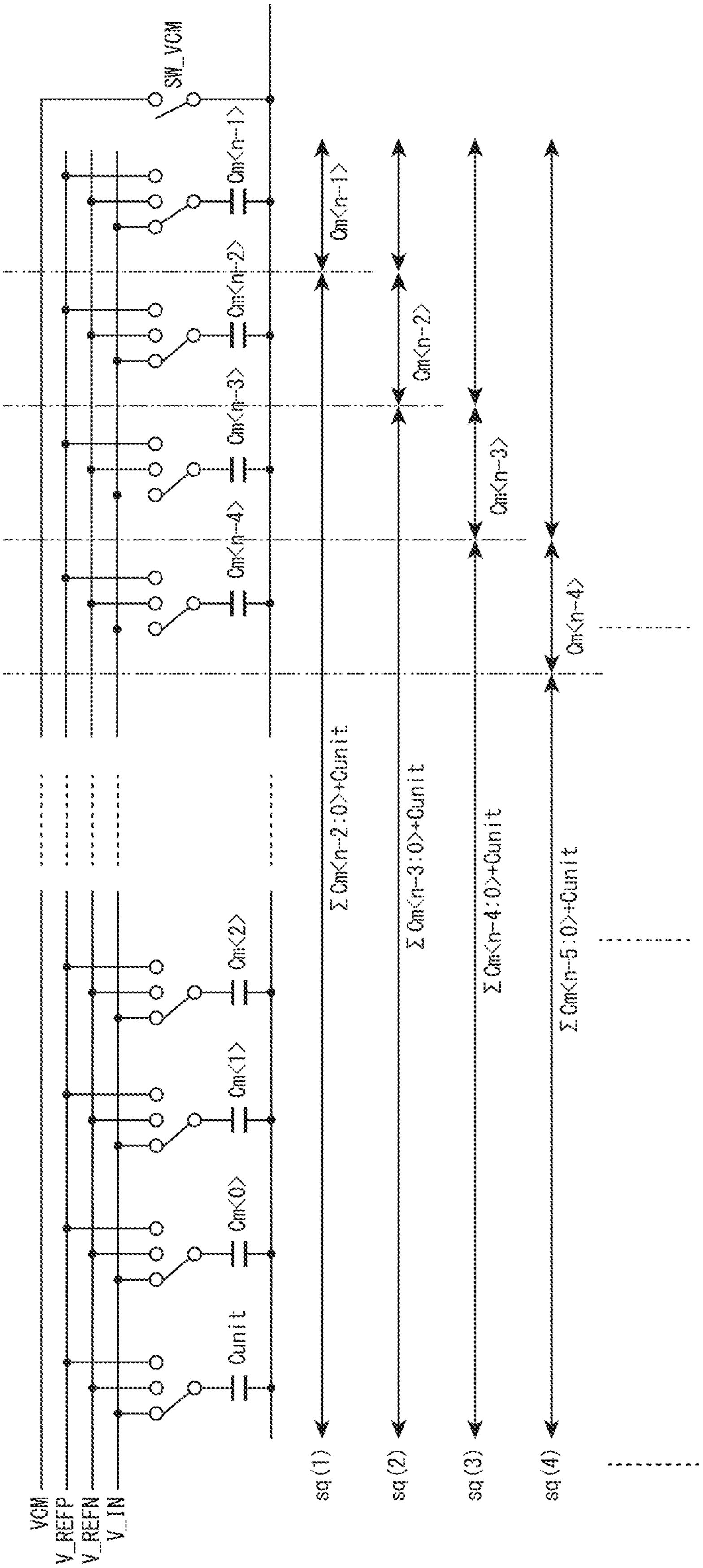
FIG. 3 is a diagram for illustrating a basic concept of correction for the CDAC in the successive-approximation ADC according to the first embodiment of the present invention.

FIG. 3 is a diagram for describing the basic concept of linearity correction for CDAC in the successive-approximation ADC according to the first embodiment of the present invention. Here, the CDAC 110 (i.e., CDAC core 111) is assumed to have an n-bit configuration of the capacitors Cm<0> to Cm<n−1>).

Referring to the figure, Linearity correction is performed sequentially from the upper bits to the lower bits, a sequence sq(1) to correct the capacitor Cm<n−1> corresponding to MSB in the main capacitor bank 111*a*, a sequence sq(2) to correct the capacitor Cm<n−2>, a sequence sq(3) to correct the capacitor Cm<n−3>, . . . , a sequence sq(n) to correct the capacitor Cm<0> corresponding to LSB. Correction is performed in each sequence sq so that the capacitance value of the capacitor Cm corresponding to the upper bits including the predetermined bit to be corrected is equal to the capacitance value of the sum of the capacitors Cm and Cm_unit corresponding to the lower bits, that is, Cm<n−1>=ΣCm<n−2:0>+Cm_unit.

For example, for CDAC with a 3-bit configuration (n=3), $$Cm<2> = Cm<1>+Cm<0>+\mathrm{Cm\_unit} \qquad \text{sq (1)}$$

$$Cm<1> = Cm<0>+\mathrm{Cm\_unit} \qquad \text{sq (2)}$$

$$Cm<0>+\mathrm{Cm\_unit} \qquad \text{sq (3)}$$

Thus, in the process of sequentially determining the corrected capacitance values (capacitance values supplied by the auxiliary capacitor Ca) for the capacitors Cm<n−1> corresponding to MSB to the capacitors Cm<0> corresponding to LSB in the main capacitor bank 111*a*, the capacitance value of the capacitor Cm of the lower bits depends on the capacitance values of the capacitors Cm of all the bits on the higher side.

(Example of Circuit Configuration for Corrected Capacitance Value Designation Circuit)

Figure 4:
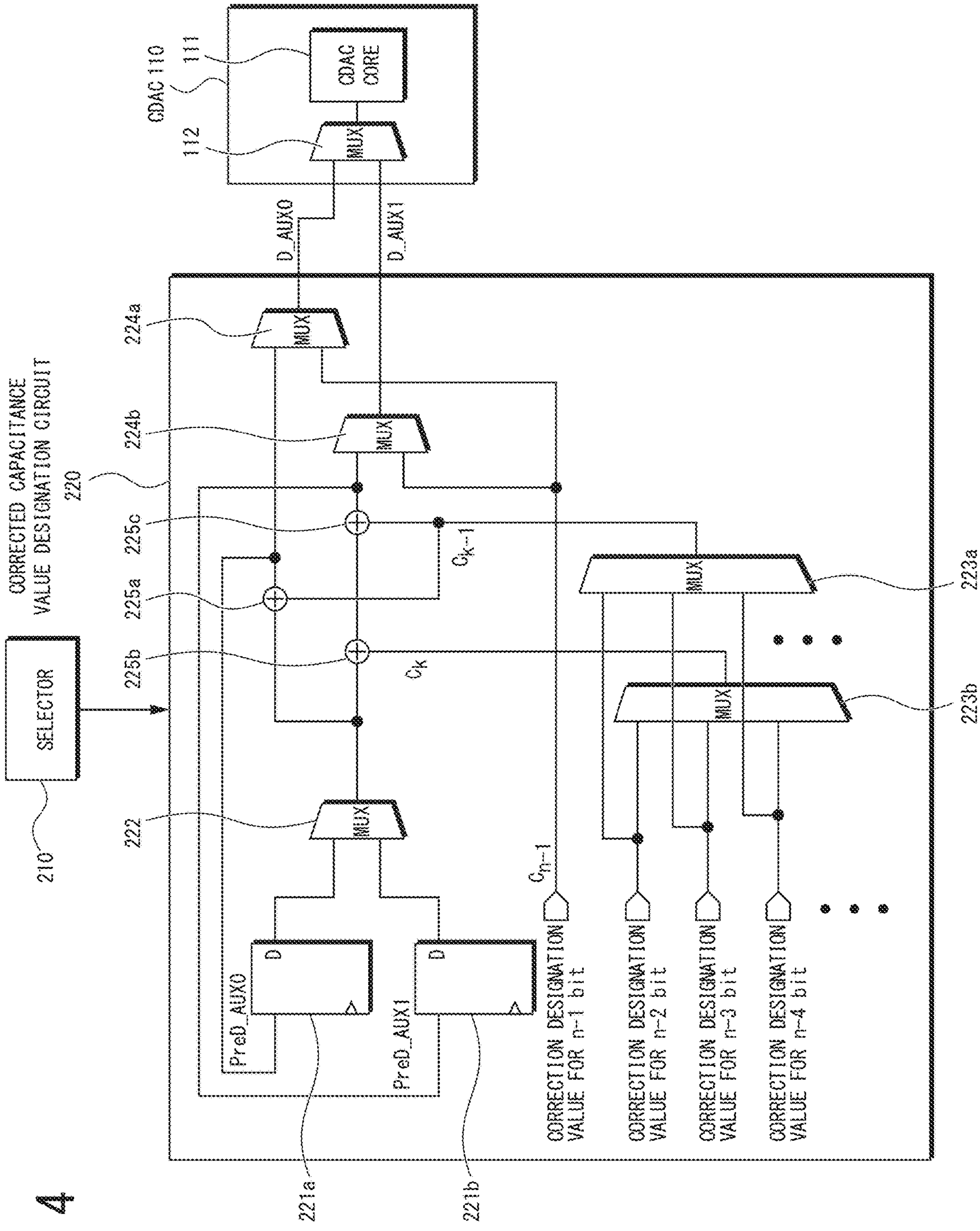
FIG. 4 is a diagram illustrating an example of a configuration of a corrected capacitance value designation circuit in the successive-approximation ADC according to the first embodiment of the present invention.

FIG. 4 is a diagram illustrating an example of a configuration of a corrected capacitance value designation circuit in the successive-approximation ADC according to the first embodiment of the present invention. As described above, the corrected capacitance value designation circuit 220 is a circuit for outputting to the CDAC 110 a correction designation value that designates to the CDAC 110 the corrected capacitance value to be supplied to each capacitor Cm in the main capacitor bank 111*a* obtained by linearity correction. As illustrated in FIG. 4, the corrected capacitance value designation circuit 220 includes, for example, a flip-flop 221, multiplexers 222 to 224, and an adder 225.

The flip-flop 221 is a D flip-flop circuit for holding the value of a correction designation signal D_AUX (correction designation value D_AUX) supplied to the CDAC 110 at 1 bit earlier in time. In other words, the flip-flop 221 is configured so that the correction designation signal D_AUX supplied to the CDAC 110 is directly fed back during the operation of the successive-approximation ADC 1. In the present disclosure, since the value of the supplied correction designation signal D_AUX is a logical value of either a first value (e.g., "0") or a second value (e.g., "1"), two flip-flops 221*a* and 221*b* are provided to hold each of the values of a pre-correction designation signal PreD_AUX0/1 (hereinafter referred to as "pre-correction designation value" and referred to as "pre-correction designation value PreD_AUX0/1") at 1 bit earlier in different times each other. Which of the correction designation signals PreD_AUX (i.e., the correction designation value at one fed-back bit earlier in time) of the flip-flops 221*a* and 221*b* is used is determined based on the comparison result signal COMP output from the latch circuit 130. For the capacitor Cm<n−1> corresponding to MSB of the CDAC 110 (i.e., CDAC core 111), the flip-flops 221*a* and 221*b* are set to an initial value "0", for example, because there is no correction designation value at 1 bit earlier in time.

The multiplexer 222 is a circuit for selectively outputting the correction designation values output from each of the flip-flops 221*a* and 221*b* under the control of the selector 210. In other words, while the successive-approximation ADC 1 is operating in normal mode, the selector 210 controls the multiplexer 222 so that the pre-correction designation signal PreD_AUX from one of the flip-flops 221*a* and 221*b* is output, based on the comparison result signal COMP output from the latch circuit 130. In response to this control, the multiplexer 222 selectively outputs one of the pre-correction designation signals PreD_AUX output from the flip-flops 221*a* and 221*b*.

The multiplexer 223 is a circuit for selectively outputting correction designation values for the capacitors Cm<n−2:0> of the CDAC 110 under the control of selector 210. In the present example, the multiplexer 223 is provided with multiplexers 223*a* and 223*b*. Each of multiplexers 223*a* and 223*b* is input with a correction designation value corresponding to the capacitors Cm<n−2:0>. The multiplexers 223*a* and 223*b* selectively output correction designation values of any bit under the control of selector 210. The correction designation values selectively output by the multiplexers 223*a* and 223*b* are input to the adder 225.

The multiplexer 224 is a circuit for selectively outputting the correction designation value for the capacitors Cm<n−1> corresponding to MSB. In the present example, the multiplexer 224 is provided with multiplexers 224*a* and 224*b*. The selector 210 controls the multiplexers 224*a* and 224*b* so that the correction designation value for n−1 bits (MSB) is selected for the correction for the capacitor Cm<n−1> corresponding to MSB. In response to this control, the multiplexer 224*a* selectively outputs the correction designation value for MSB as a correction designation signal D_AUX0, while the multiplexer 224*b* selectively outputs the correction designation value for MSB as a correction designation signal D_AUX1.

The adder 225 is a circuit that performs a logical OR operation between the output from the multiplexer 222 and the output from the multiplexer 223. The adder 225 consists of adders 225*a* to 225*c* in the present example. As illustrated in FIG. 4, the output from the multiplexer 222 is split into two, one of which is added to an output Ck−1 from the multiplexer 223*a* by the adder 225*a* and the result is input to the flip-flop 221*a* as a pre-correction designation signal PreD_AUX0, and the other is first added to an output Ck from the multiplexer 223*b* by the adder 225*b*, then added to the output from the multiplexer 223*a* by the adder 225*c*, and the result is input to the flip-flop 221*a* as a pre-correction designation signal PreD_AUX1.

The relationship between the pre-correction designation signal preD_AUX0/1 and the correction designation signal D_AUX0/1 in the corrected capacitance value designation circuit 220 configured as described above is shown below.

$$\mathrm{PreD\_AUX0}[k-1] = \mathrm{PreD\_AUX}[k]$$

$$\mathrm{PreD\_AUX1}[k-1] = \mathrm{PreD\_AUX}[k] + C_k$$

$$\mathrm{D\_AUX0}[k-1] = \mathrm{PreD\_AUX}[k] + C_{k-1}$$

$$\mathrm{D\_AUX1}[k-1] = \mathrm{PreD\_AUX}[k] + C_k + C_{k-1}$$

Where, k indicates the predetermined bit to be corrected (i.e., capacitor Cm), and the range is 0≤k≤ n−1 (i.e., MSB is indicated as a k-th bit). PreD_AUX [k] indicates the output of the multiplexer 222.

It is noted that, if the correction target is the capacitor Cm<n−1> corresponding to MSB (k=n−1), because one previous bit is not present, the correction designation signal D_AUX0/1 output to the CDAC 110 is as follows:

$$\mathrm{D\_AUX0}[n-1] = C_{n-1}$$

$$\mathrm{D\_AUX1}[n-1] = C_{n-1}$$

Further, for example, if the correction target is one lower bit of MSB (capacitor Cm<n−2>), the initial value of the pre-correction designation signal PreD_AUX0/1 for MSB is "0" and the correction designation signal D_AUX0/1 output to the CDAC 110 is as follows:

$$\begin{aligned}\mathrm{D\_AUX0}[n-2] &= \mathrm{PreD\_AUX}[n-1] + C_{n-2}\\ &= C_{n-2}\\ \mathrm{D\_AUX1}[n-2] &= \mathrm{PreD\_AUX}[n-1] + C_{n-1} + C_{k-2}\\ &= C_{n-1} + C_{n-2}\end{aligned}$$

Therefore, the pre-correction designation signal PreD_AUX0/1 is as follows:

$$\mathrm{PreD\_AUX0}[n-2] = \mathrm{PreD\_AUX}[n-1] + C_{n-2}$$

$$\mathrm{PreD\_AUX1}[n-2] = \mathrm{PreD\_AUX}[n-1] + C_{n-1} + C_{n-2}$$

If the correction target is the two lower bits of MSB (capacitor Cm<n−3>) (k=n−3), the pre-correction designation signal PreD_AUX0/1 is as follows:

$$\begin{aligned}\mathrm{D\_AUX0}[n-3] &= \mathrm{PreD\_AUX}[n-2] + C_{n-3}\\ &= C_{n-2} + C_{n-3}\\ \mathrm{D\_AUX1}[n-3] &= \mathrm{PreD\_AUX1}[n-2] + C_{n-2} + C_{n-3}\\ &= C_{n-1} + C_{n-2} + C_{n-3}\end{aligned}$$

Therefore, the pre-correction designation signal PreD_AUX0/1 is as follows:

$$\mathrm{PreD\_AUX0}[n-3] = \mathrm{PreD\_AUX}[n-1] + C_{n-2} + C_{n-3}$$

-continued $$\mathrm{PreD\_AUX1}[n-3] = \mathrm{PreD\_AUX}[n-1] + C_{n-1} + C_{n-2} + C_{n-3}$$

Figure 8:
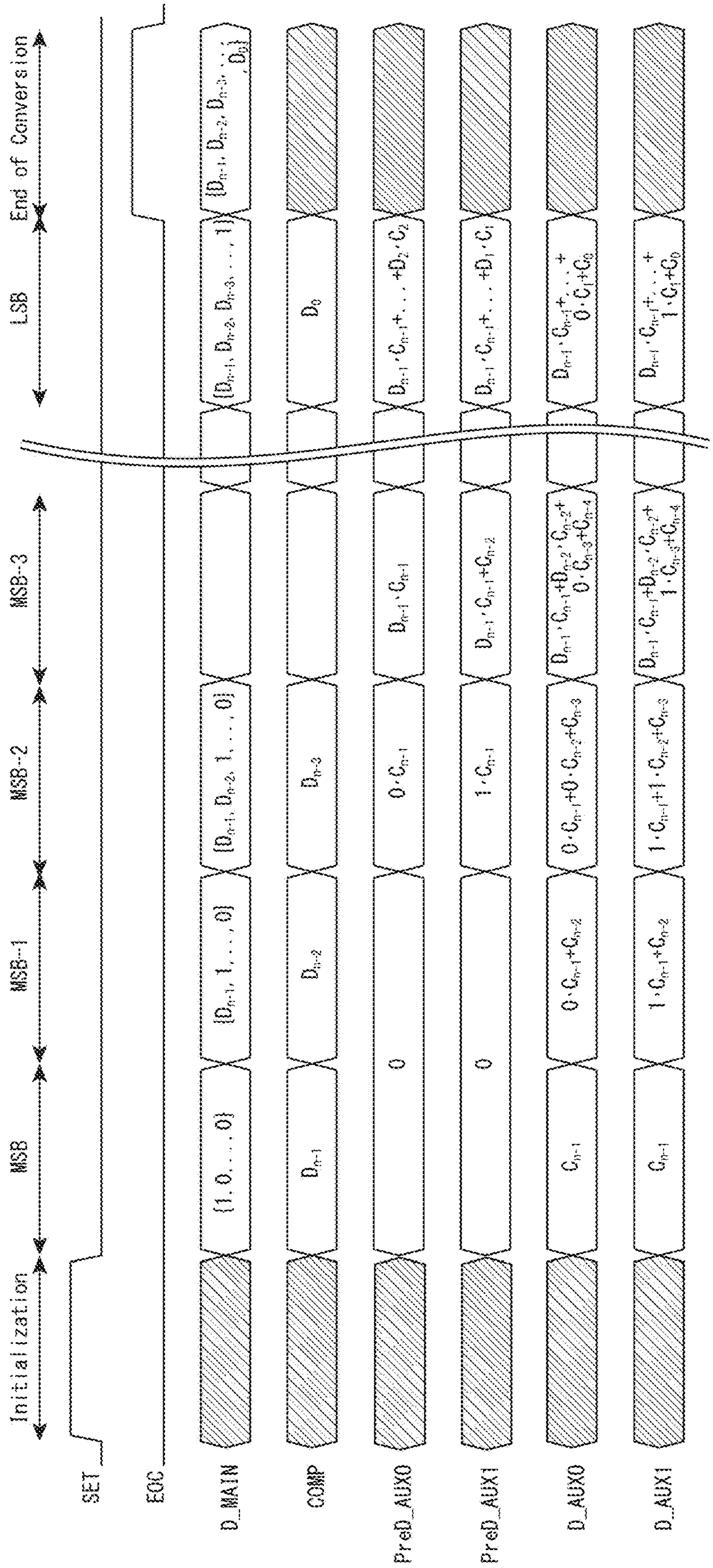
FIG. 8 is a detailed sequence diagram for illustrating an example of linearity correction for the CDAC of the successive-approximation ADC according to the first embodiment of the present invention.

Hereafter, the correction designation signal D_AUX0/1 is calculated similarly for the bit k to be corrected, and the pre-correction designation signal PreD_AUX0/1 is obtained accordingly (see FIG. 8). Next, the flow of the correction processing for CDAC in the successive-approximation ADC 1 configured as described above is described.

(Flowchart)

Figure 5A:
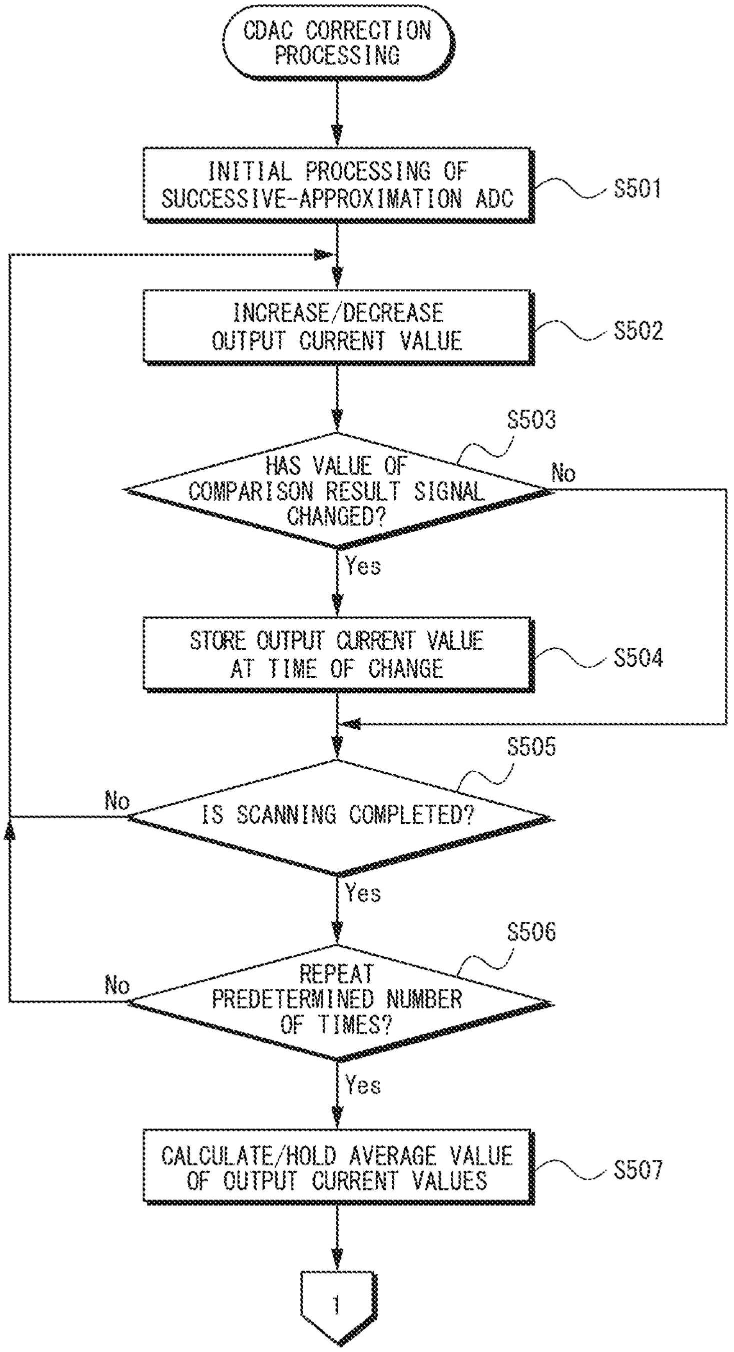
FIG. 5A is a flowchart illustrating an example of the correction processing for a CDAC in the successive-approximation ADC according to the first embodiment of the present invention.
Figure 5B:
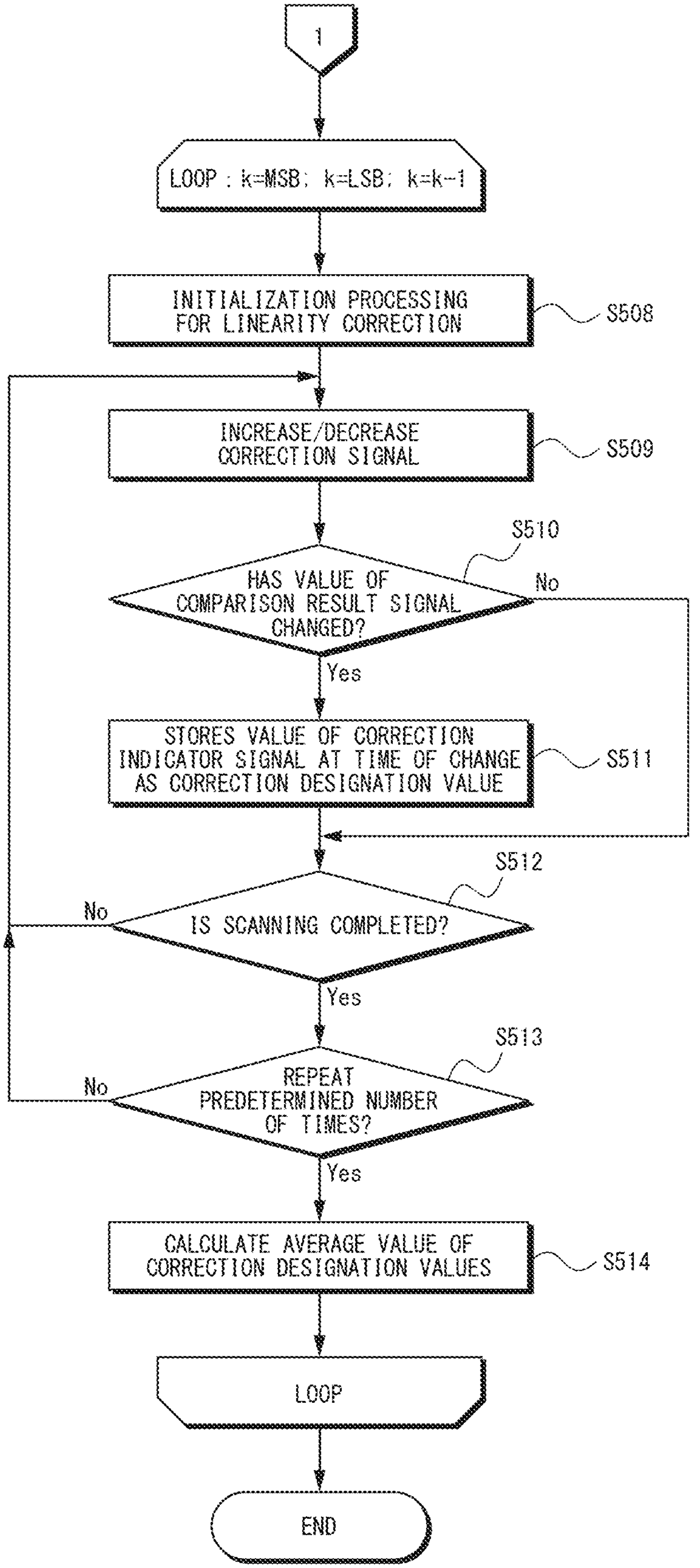
FIG. 5B is a flowchart illustrating an example of the correction processing for the CDAC in the successive-approximation ADC according to the first embodiment of the present invention.

FIGS. 5A and 5B are flowcharts illustrating an example of the correction processing for CDAC in the successive-approximation ADC according to the first embodiment of the present invention. Such processing is realized by the ADC control circuit 20 of the successive-approximation ADC 1 controlling the ADC body circuit 10 under the control of the system control circuit 30. As described above, in the correction processing of the present disclosure, after the offset correction illustrated in FIG. 5A is executed, the linearity correction illustrated in FIG. 5B is subsequently executed.

As illustrated in FIG. 5A, if the ADC control circuit 20 receives the correction enable signal CAL_EN from the system control circuit 30, the ADC control circuit 20 starts executing offset correction for the comparator as shown below (S501 to S507). In offset correction, a plurality of times of scanning is executed, for example, to specify offset corrected values.

Specifically, the ADC control circuit 20 performs initialization processing of the successive-approximation ADC 1 by starting the execution of offset correction (S501). For example, the ADC control circuit 20 initializes the corrected capacitance value designation circuit 220 and fixes the correction designation signals D_AUX0 and D_AUX1 (hereinafter, referred to as "correction designation signal D_AUX0/1" unless otherwise distinguished) to predetermined values (e.g., "0"), and initializes the offset correction control circuit 240 and sets a current adjustment signal SEL_ADC_OFFCAL to an initial value (e.g., "0x00"). The ADC control circuit 20 outputs an offset correction enable signal EN_ADC_OFFCAL to the offset correction circuit 150, which becomes active in response. Furthermore, the ADC control circuit 20 outputs a set signal SET to the CDAC 110, which causes the CDAC 110 to begin to hold the potential of the differential analog input signal Vin.

The ADC control circuit 20 then increases or decreases the value of the current adjustment signal SEL_ADC_OFFCAL in a stepwise or gradual manner to increase or decrease the output current value of the offset correction circuit 150 (S502), and determines whether the state (value) of the comparison result signal COMP has changed as a result (S503).

If it is determined that the value of the comparison result signal COMP has changed (Yes in S503), the ADC control circuit 20 temporarily stores the output current value indicated by the current adjustment signal SEL_ADC_OFFCAL at the time of the change (change point) (S504). The ADC control circuit 20 then determines whether or not scanning has been completed (S505). If it is determined that scanning has not yet been completed (No in S505), the ADC control circuit 20 increases or decreases the value of the current adjustment signal SEL_ADC_OFFCAL in a stepwise or gradual manner (S502).

On the other hand, If the ADC control circuit 20 determines that the value of the comparison result signal COMP has not changed (No in S503), the ADC control circuit 20 increases or decreases the value of the current adjustment signal SEL_ADC_OFFCAL in a stepwise or gradual manner until scanning is completed (S502).

As the offset correction is for detecting errors in the comparison result signal COMPout of the analog comparator 120, the value of the current adjustment signal SEL_ADC_OFFCAL is controlled to increase or decrease within a predetermined range centered on a theoretical value ("0 in the present example), for example.

If the ADC control circuit 20 determines that scanning has been completed (Yes in S505), the ADC control circuit 20 further determines whether scanning has been executed a predetermined number of times (S506). If it is determined that a predetermined number of times of scanning has not been executed (No in S506), the ADC control circuit 20 repeats the above processing steps (S502 to S505) until a plurality of times of scanning is completed.

On the other hand, if the ADC control circuit 20 determines that a predetermined number of times of scanning has been executed (Yes in S506), the ADC control circuit 20 calculates the average value of the temporarily stored output current values and holds this value as a definitive output current value (S507).

With the above, the ADC control circuit 20 completes the execution of offset correction for the comparator, and then proceeds to the execution of linearity correction for the CDAC 110. Linearity correction is executed by a sequence to specify the corrected capacitance value of the capacitor Cm<k> in descending order from the capacitor Cm<n−1> corresponding to MSB of the CDAC 110 to the capacitor Cm<x> corresponding to any lower bit x (minimum is LSB (x=0)). In the present example, the sequence is assumed to be executed in descending order to LSB.

Specifically, the ADC control circuit 20 performs the initialization processing for linearity correction of the capacitor Cm<k> to be corrected (S508). For example, the ADC control circuit outputs the set signal SET to the CDAC 110, and in response to this, the CDAC 110 controls the switch SWm to form a predetermined capacitor connection configuration for sample/hold (see FIG. 9, for example). After sample/hold, the ADC control circuit 20 switches the capacitor connection configuration during sample/hold to the capacitor connection configuration during linearity correction. The ADC control circuit 20 then sets the value of the digital output signal D_MAIN to the digital code to be output by the capacitor Cm<k> to be corrected (for example, 2^(n−1)×C when the capacitor Ca<n−1>). The ADC control circuit 20 initializes the corrected capacitance value designation circuit 220 and sets the correction designation signal D_AUX0/1 to a predetermined value corresponding to the capacitor Cm to be corrected.

To specify the optimal correction designation value for the capacitor Cm<k> to be corrected, the ADC control circuit 20 increases or decreases the value of the correction designation signal D_AUX0/1 in a stepwise or gradual manner and increases or decreases the capacitance value supplied from the auxiliary capacitor bank 111*b* to the capacitor Cm in response (S509), and determines whether the state (value) of the comparison result signal COMP has changed as a result (S510).

If the ADC control circuit 20 determines that the value of the comparison result signal COMP has changed (Yes in S510), the ADC control circuit 20 temporarily stores the value designated by the correction designation signal D_AUX0/1 at the time of the change as a pre-correction designation value (S511). The ADC control circuit 20 then determines whether or not scanning has been completed (S512). If it is determined that scanning has not yet been completed (No in S512), the ADC control circuit 20 increases or decreases the value of the correction designation signal D_AUX0/1 in a stepwise or gradual manner (S509). In other words, as the value of the bit to be corrected in the digital output signal D_MAIN output from the logic circuit 140 has two patterns of "0" or "1," in the linearity correction of the present disclosure, in a process of feeding back the value of the comparison result signal COMP to the corrected capacitance value designation circuit 220, two correction designation values are held in advance as the values of the pre-correction designation signal PreD_AUX0/1 (that is, pre-correction designation values), and one of the two pre-correction designation values is selected based on the value of the comparison result signal COMP, based on which the next (latest) two correction designation signals D_AUX0/1 is generated.

On the other hand, if the ADC control circuit 20 determines that scanning has been executed a predetermined number of times (Yes in S512), the ADC control circuit 20 calculates the average value of the temporarily stored correction designation values and holds this value as the definitive output current value for the capacitor Cm<k> to be corrected (S514).

The ADC control circuit 20 repeats the above processing until the correction designation value of the capacitor Cm<k> corresponding to any lower bit is specified.

Next, the various operations of the correction processing for CDAC in the successive-approximation ADC 1 are described.

(Offset Correction)

Figure 6:
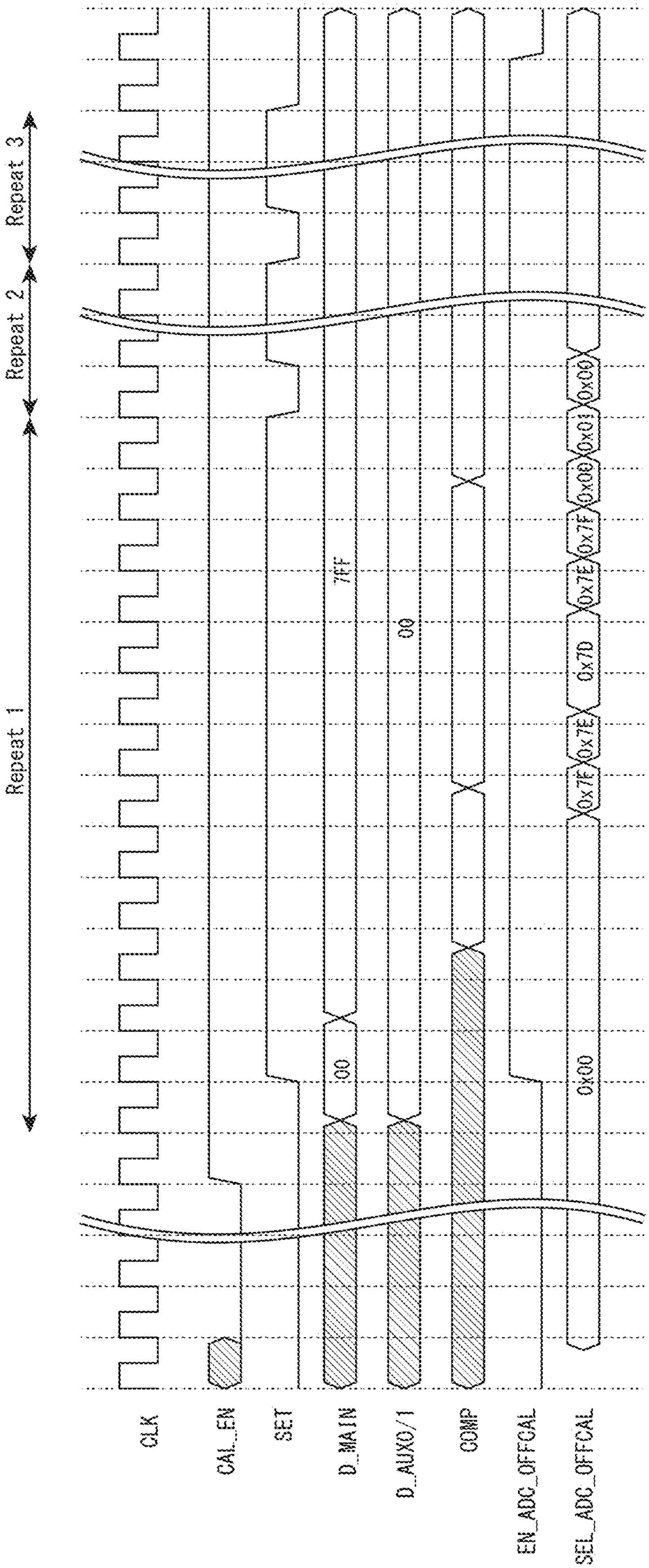
FIG. 6 is a sequence diagram for illustrating offset correction for an analog comparator in the successive-approximation ADC according to the first embodiment of the present invention.

FIG. 6 is a sequence diagram for describing offset correction for an analog comparator in the successive-approximation ADC according to the first embodiment of the present invention. Such offset correction is typically performed by increasing or decreasing the output current value of the offset correction circuit 150 under the control of the ADC control circuit 20. In this figure, hatched parts indicate indefinite values.

As illustrated in FIG. 6, the system control circuit 30 first outputs the correction enable signal CAL_EN to the ADC control circuit 20 to start the correction of the CDAC 110. Upon receipt of this, the ADC control circuit 20 starts operating in correction mode, and the state machine 230 outputs the set signal SET to the CDAC 110 and the offset correction enable signal EN_ADC_OFFCAL to the offset correction circuit 150. The offset correction control circuit 240 outputs the current adjustment signal SEL_ADC_OFFCAL to the CDAC 110 with an initial value of "0x00". The current adjustment signal SEL_ADC_OFFCAL is used to set the output current value of the IDAC of the offset correction circuit 150. In the present example, the current adjustment signal SEL_ADC_OFFCAL is set to a 7-bit signal, and the MSB thereof is set to a sign bit. The value of the current adjustment signal SEL_ADC_OFFCAL is indicated by two's complement. The CDAC 110 receives the set signal SET and begins to hold the potential of the differential analog input signal Vin. At this time, the correction designation signals D_AUX0/1 for linearity correction output from the corrected capacitance value designation circuit 220 are each fixed to the value "0." Subsequently, CDAC 110 starts operating upon receiving the offset correction enable signal EN_ADC_OFFCAL, and the comparison result signal COMP output from the latch circuit 130 via analog comparator 120 stabilizes at a predetermined value.

The offset correction control circuit 240 then executes a search sequence to specify or detect the optimal offset corrected value by changing the value of the current adjustment signal SEL_ADC_OFFCAL in a stepwise or gradual manner. In the present example, the search sequence is executed three times, and the average value of the detected values is the final offset corrected value for the analog comparator 120.

Specifically, the offset correction control circuit 240 changes the value of the current adjustment signal SEL_ADC_OFFCAL by one step in each search sequence, and in response, the offset correction circuit 150 changes the output current difference of IDAC by one step. By way of this, the offset correction control circuit 240 observes whether the value of the comparison result signal COMP changes or not.

If it is determined that the state (value) of the comparison result signal COMP has changed (inverted) while the value of the current adjustment signal SEL_ADC_OFFCAL is being changed, the offset correction control circuit 240 holds the value of the current adjustment signal SEL_ADC_OFFCAL at the time of the change as the detected value. The offset correction control circuit 240 calculates an average value based on the detected values in each search sequence and sets this value in a register as the offset corrected value.

If the offset corrected value setting is completed, the state machine 230 stops outputting the set signal SET, and the offset correction control circuit 240 stops outputting the offset correction enable signal EN_ADC_OFFCAL.

By executing the offset correction described above, the offset correction circuit 150 supplies an output current based on the set offset corrected value to the input side of the latch circuit 130. As a result, since the difference between the differential comparison result signals COMPout_P and COMPout_N input to the latch circuit 130 from the analog comparator 120 during the operation of the successive-approximation ADC 1 is “0” or substantially “0”, the output logic threshold of the latch circuit 130 is set accurately.

(Linearity Correction)

Figure 7:
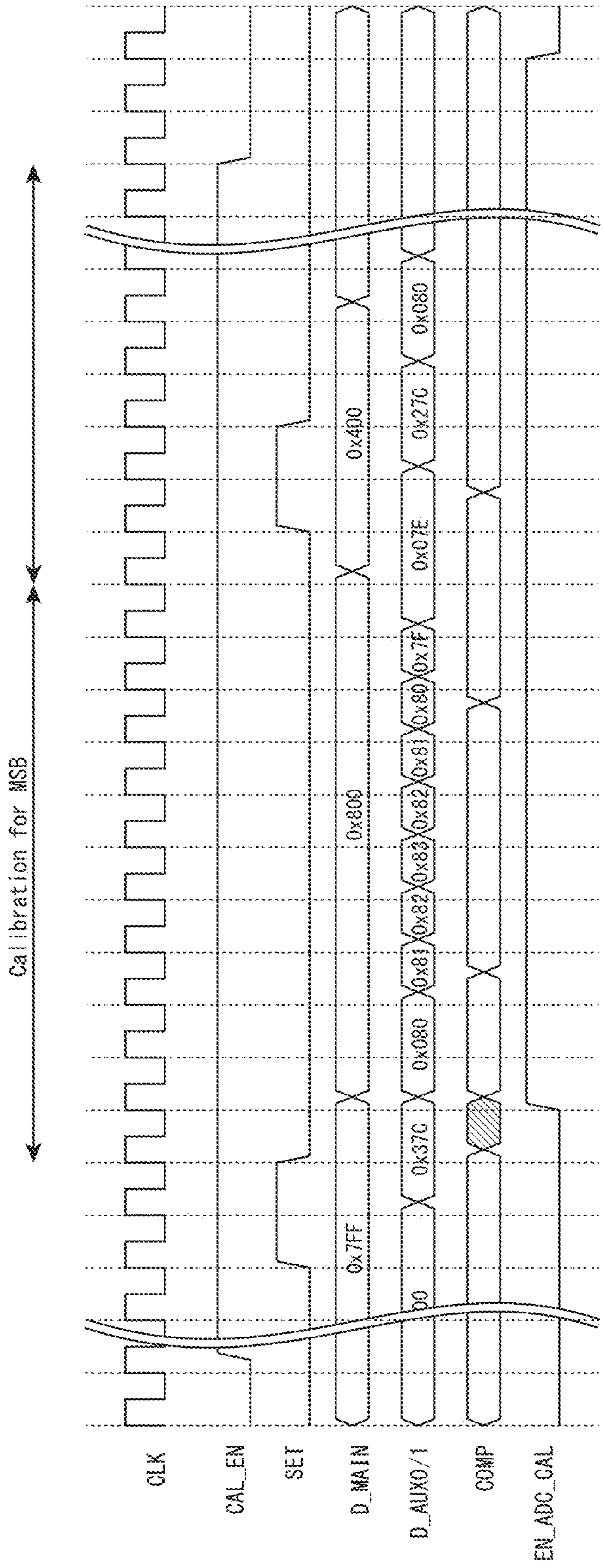
FIG. 7 is a schematic sequence diagram for illustrating an example of linearity correction for the CDAC of the successive-approximation ADC according to the first embodiment of the present invention.

FIG. 7 is a schematic sequence diagram for describing an example of linearity correction for CDAC of the successive-approximation ADC according to the first embodiment of the present invention.

Linearity correction is performed by executing a sequence sq to specify the appropriate corrected capacitance value for each capacitor Cm in the main capacitor bank 111*a* by changing the correction designation value output from the corrected capacitance value designation circuit 220 to the CDAC 110 in a stepwise manner. As described above, offset correction for the comparator is completed prior to linearity correction for the CDAC 110.

As described above, the linearity correction for the CDAC 110 is performed in sequence from the capacitor Cm<n> corresponding to MSB to the capacitor Cm<0> corresponding to LSB. The state machine 230 outputs the set signal SET to the CDAC 110, and then outputs the linearity correction enable signal EN_ADC_CAL to the CDAC 110. In response to this, the CDAC 110 controls the switch SWm so that only capacitors Cm_unit and Cm<n> are operated as a sequence for MSB. In addition, in this state, the corrected capacitance value designation circuit 220 begins to output the digital output signal D_MAIN at, for example, “0x800”.

The corrected capacitance value designation circuit 220 changes the correction designation signal D_AUX0/1 in a stepwise manner under the control of the selector 210. The selector 210 observes whether the value of the comparison result signal COMP output via the latch circuit 130 changes or not. If it is detected that the value of the comparison result signal COMP has changed, the selector 210 notifies the corrected capacitance value designation circuit 220, and upon receipt of this, the corrected capacitance value designation circuit 220 holds the value of the correction designation signal D_AUX0/1 at this time as the correction designation value that specifies the corrected capacitance value for the capacitor Cm to be corrected. That is, the corrected capacitance value designation circuit 220 specifies the change point by changing the correction designation signal D_AUX0/1 in a stepwise manner. In this way, the corrected capacitance value designation circuit 220 specifies and holds the complementary capacitance value for each capacitor Cm.

The details of the linearity correction for the CDAC 110 of the successive-approximation ADC 1 are described next, with reference to FIG. 7. FIG. 7 is a detailed sequence diagram for describing an example of linearity correction for CDAC of the successive-approximation ADC according to the first embodiment of the present invention.

As described above, the logic circuit 140 performs serial-to-parallel conversion by mapping 1 bit of the input comparison result signal COMP to a code bit in parallel format in sequence, and outputs the N-bit digital code as the digital output signal D_MAIN on the cycle of an end-of-conversion signal EOC. In the successive-approximation ADC 1, in the process of converting to the N-bit digital code, it is determined whether the output value based on the value of the difference comparison result signal COMPout (the value of the comparison result signal COMP) becomes “0” or “1” from MSB to LSB of the digital output signal D_MAIN.

As described above, since the possible output values of the latch circuit 130 are two patterns of “0” or “1”, in the linearity correction of the present disclosure, in a case where feeding back the output value to the corrected capacitance value designation circuit 220, two correction designation values corresponding to the output value are prepared in advance as pre-correction designation values, and one of the two pre-correction designation values is selected based on the value of the comparison result signal COMP, based on which two most recent correction designation values are calculated. One of the two calculated correction designation values is selected based on the value of the comparison result signal COMP. In other words, the corrected capacitance value designation circuit 220 holds in advance as pre-correction designation values the values computed at 1 bit earlier in time before the latch circuit 130 outputs the comparison result signal COMP corresponding to the next bit, selects one of the two pre-correction designation signals PreD_AUX0/1 according to the value of the fed-back comparison result signal COMP, and calculates based on one of the selected pre-correction designation signals PreD_AUX0/1. The CDAC 110 uses the multiplexer 112 to select one of the two calculated correction designation signals D_AUX0/1 according to the comparison result signal COMP, which switches and controls the connection configuration of the capacitor Ca to ensure the capacitance value supplied to the capacitor Cm.

Specifically, as illustrated in FIG. 8, the CDAC 110 is initialized by the set signal SET, at which time the value of the pre-correction designation signal PreD_AUX0/1 is set to an initial value (Cn in the present example).

Then, in the sequence of the capacitors Cm<n> corresponding to MSB, the digital output signal D_MAIN is set to a target n-bit digital code $\{1, 0, \ldots, 0\}$, and the correction designation signal D_AUX0/1 is supplied to the ADC body circuit 10. As a result, the comparison result signal COMP is output. In this figure, the value of the comparison result signal COMP is shown as Dn−1 (1 bit). At this time, the correction designation value that specifies the corrected capacitance value for the capacitor Cm<n−2> corresponding to the next bit (one lower bit of MSB) is computed as the pre-correction designation value PreD_AUX0/1, and since there is no dependent value beyond this value, each correction designation value is computed with the initial value "0."

Subsequently, in the sequence of the capacitors Cm<n−2> corresponding to the next bit (one lower bit of MSB), the digital output signal D_MAIN is set to the next target n-bit digital code {Dn−1, 1, 0, . . . , 0}. It is noted that the digital code corresponding to MSB is the value of the comparison result signal COMP obtained one sequence earlier (i.e., Dn−1). The pre-correction designation value PreD_AUX0/1 is then supplied as the correction designation signal D_AUX0/1, and similarly, the comparison result signal COMP is output.

Similarly, the value of the correction designation signal D_AUX0/1 one sequence earlier is held as the pre-correction designation signal PreD_AUX0/1 before the comparison result signal COMP is output, and is supplied as the correction designation signal D_AUX0/1 in a predetermined sequence of bits to be corrected, and one of the pre-correction designation signals is selected according to the value of the comparison result signal COMP.

Figure 9:
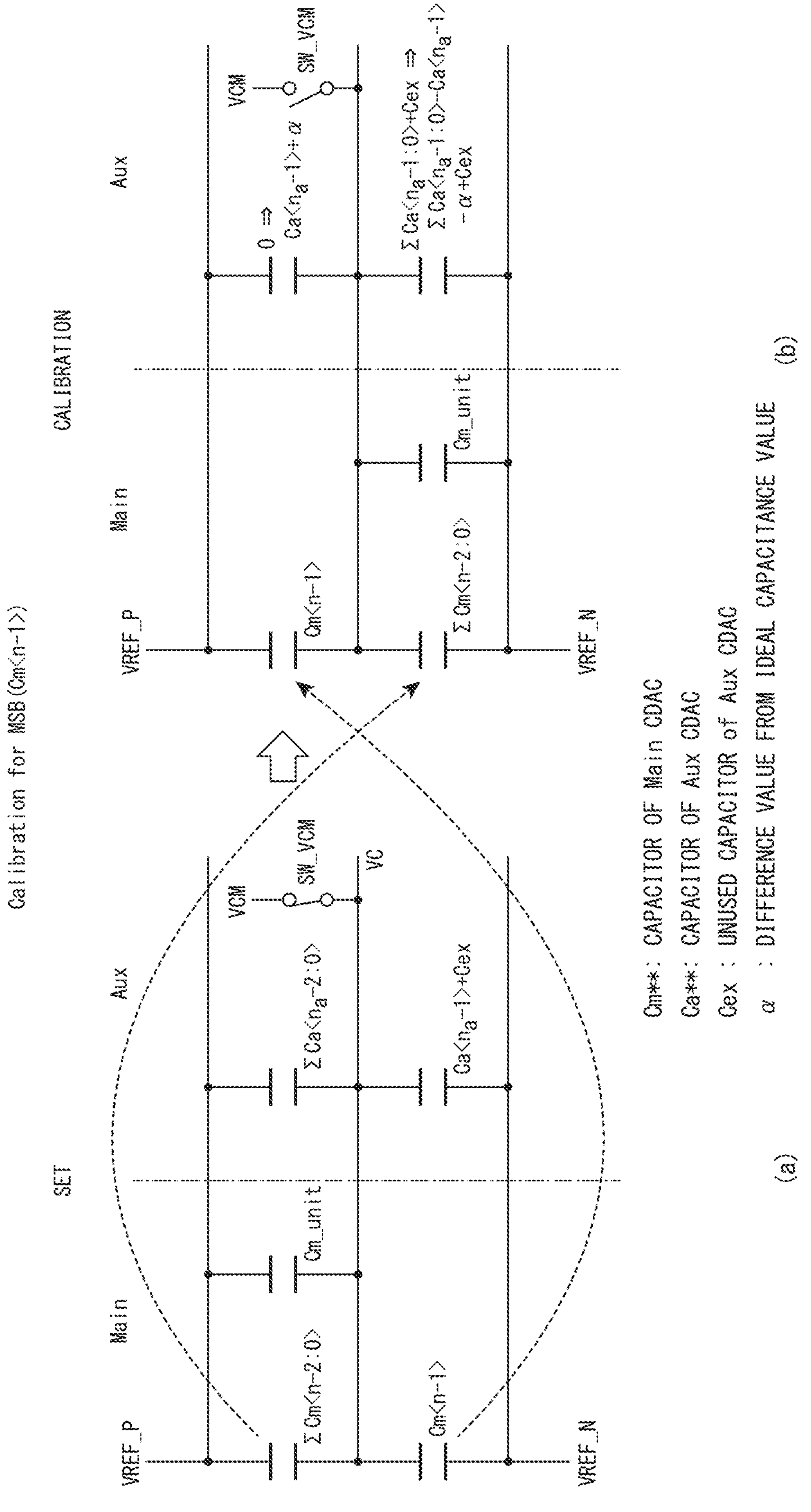
FIG. 9 is a diagram illustrating an example of a capacitor connection configuration during linearity correction for the CDAC of the successive-approximation ADC according to the first embodiment of the present invention.
Figure 10:
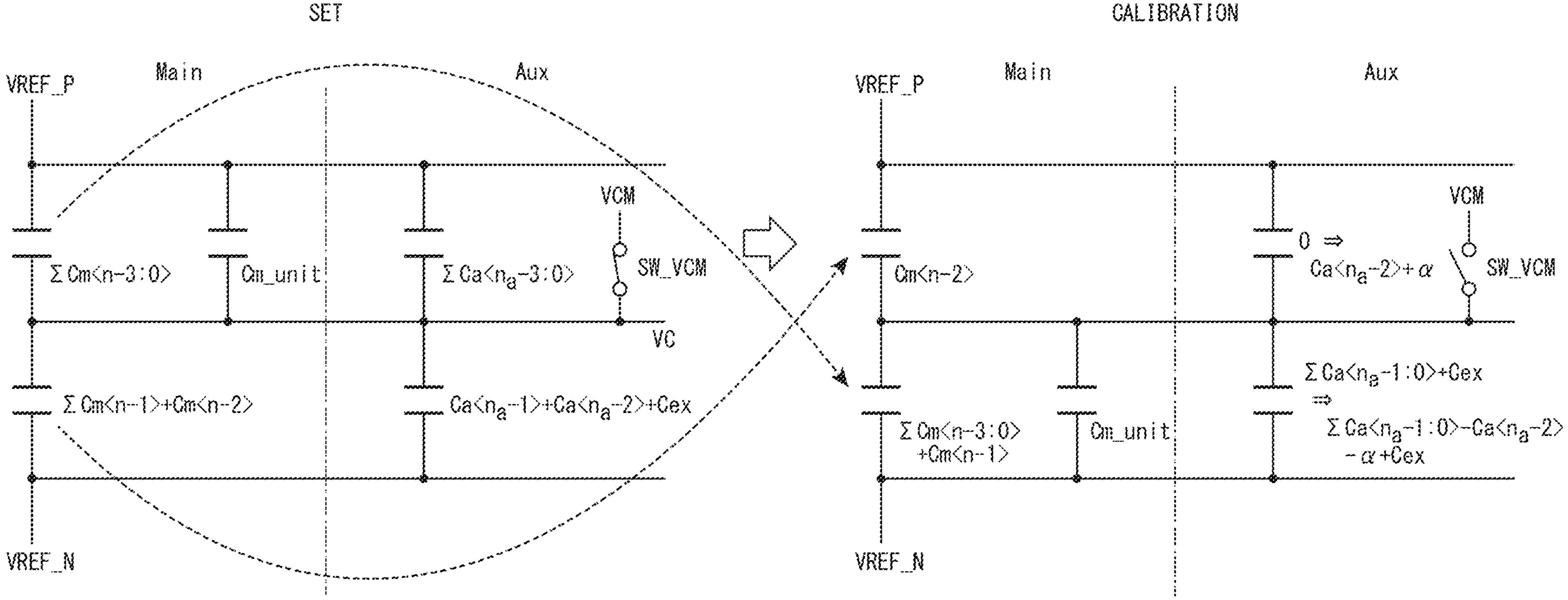
FIG. 10 is a diagram illustrating an example of a capacitor connection configuration during linearity correction for the CDAC of the successive-approximation ADC according to the first embodiment of the present invention.
Figure 11:
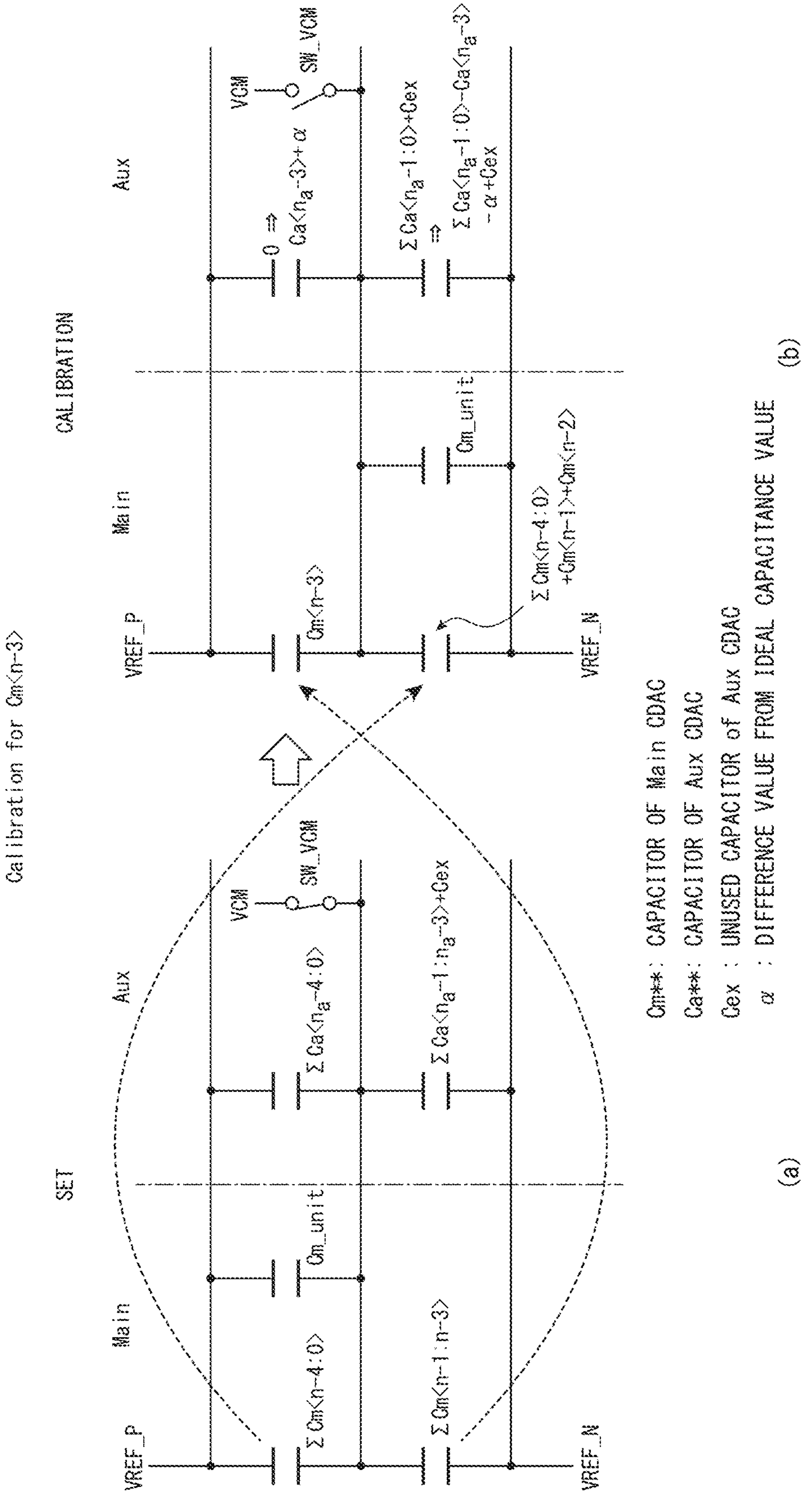
FIG. 11 is a diagram illustrating an example of a capacitor connection configuration during linearity correction for the CDAC of the successive-approximation ADC according to the first embodiment of the present invention.

Next, the circuit connection configuration in the CDAC 110 in linearity correction will be shown and described. FIGS. 9 to 11 are diagrams illustrating an example of a capacitor connection configuration during linearity correction for CDAC of the successive-approximation ADC according to the first embodiment of the present invention.

Specifically, FIG. 9 illustrates the circuit connection configuration of CDAC during linearity correction for the capacitor Cm<n−1> corresponding to MSB. In each of (a) of FIG. 9 and (b) of FIG. 9, the left side of the single-dotted line shows the capacitor connection configuration of the main capacitor bank 111*a*, while the right side shows the connection configuration of the auxiliary capacitor bank 111*b*, and each capacitor is shown as the capacitance value thereof (the same in FIGS. 9 to 11 below).

First, as illustrated in (a) of FIG. 9, by the set signal SET, the capacitor Cm<n−1> corresponding to the MSB to be corrected is connected to the reference voltage VREF_N in the main capacitor bank 111*a* of the CDAC 110, and the remaining capacitors Cm (that is, ΣCm<n−2:0>) and the capacitor Cm_unit are connected to the reference voltage VREF_P.

On the other hand, in the auxiliary capacitor bank 111*b*, the capacitor Ca<$n_a$−1> is connected to the reference voltage VREF_N, and the remaining capacitors Ca (that is, Ca<$n_a$−2:0> (the capacitance value is ΣCa<$n_a$−2:0>) is connected to the reference voltage VREF_P. The capacitor Ca<$n_a$−1> supplies the capacitance value that would be complementary when there was no variation for the capacitor Cm<n−1>. Here, Cex is the capacitance value of the unused capacitor Ca due to the above capacitor connection configuration. A capacitance value Cex changes with the capacitor Cm used to supply the complementary capacitance value. In other words, in the auxiliary capacitor bank 111*b*, for the capacitor Cm<n−1> to be corrected, the capacitor Ca is configured so that a difference value α from an ideal value (in the present example, the value a(n−1)×C subtracted from the ideal value, see FIG. 2) is complemented.

Further, the switch SW_VCM is closed, and the capacitance redistribution signal VC (see FIG. 2) is forcibly set to the common voltage VCM.

In such a state, the sequence of linearity correction for the capacitors Cm<n−1> is initiated. That is, as illustrated in (b) of FIG. 9, first, the switch SW_VCM is opened, and also the connection configuration of each capacitor Cm and capacitor Cm_unit and each capacitor Ca to each of the reference voltages VREF_P and VREF_N is reversed. Thereafter, a search is conducted to change the corrected capacitance value for Cm<n−1> by sequentially switching the connection of the capacitors Ca according to the correction designation value until the optimal corrected capacitance value that correctly outputs a desired digital output signal value is specified.

Specifically, in the linearity correction for the capacitor Cm<n−1>, the connection of the capacitor Cm<n−1> in the main capacitor bank 111*a* and the remaining capacitors Cm (that is, Cm<n−2:0>) and capacitors Cm_unit to the reference voltage is reversed. Similarly, the connection configuration to the reference voltage in the auxiliary capacitor bank 111*b* is reversed. The capacitance value of the capacitor Ca<$n_a$−1> connected to the reference voltage VREF_P is then incremented or decremented in a stepwise or gradual manner (and thus the amount is shifted to the reference voltage VREF_N). More specifically, a corrected capacitance value α is added to or subtracted from the capacitor Ca<$n_a$−1> in a stepwise or gradual manner, and the increment or decrement is selected based on the value indicated by the comparison result signal COMP (see FIG. 7). That is, when the value indicated by the comparison result signal COMP is inverted during the phase in which the corrected capacitance value α is being incremented (decremented) for the capacitor Ca<$n_a$−1>, the phase is switched to a decrementing (incrementing) phase, and this is repeated to specify the optimal corrected capacitance value α. By way of this, the search time until the optimal corrected capacitance value α is specified is reduced. As a practical matter, if too much time is taken from the setting of the set signal SET to the common voltage VCM to the completion of linearity correction, capacitance leakage in the wiring becomes non-negligible and the accuracy of linearity correction is decreased. However, an efficient search for the corrected capacitance value α, as in the present disclosure, reduces the search time and improves the accuracy of linearity correction. In a case where there was no variation in the capacitor Cm<n−1> to be corrected, at a point in time when the capacitance value Ca<$n_a$−1>, which corresponds to the predetermined capacitance value that was deducted beforehand, is reached, as the value indicated by the comparison result signal COMP is inverted, the capacitance value at that point is specified as the corrected capacitance value α for the capacitor Cm<n−1>.

In such linearity correction, preferably, the search for specifying the optimal corrected capacitance value is performed a plurality of times, and the average value calculated based on the correction designation values corresponding to a plurality of corrected capacitance values a specified will be held in a register, for example, as a definitive correction designation value.

FIG. 10 illustrates the circuit connection configuration of the CDAC during linearity correction for the capacitor Cm<n−2> corresponding to one lower bit of MSB.

Linearity correction for the capacitor Cm<n−2> corresponding to one lower bit of MSB (MSB-1) is also performed similarly as linearity correction for the capacitor Cm<n−1> corresponding to MSB described above. The capacitor Cm<n−1> and the corresponding capacitor Ca<$n_a$−1>, for which linearity correction has been completed, are always fixed to the reference voltage VREF_N side in the linearity correction for the capacitors Cm<n−2>.

Specifically, as illustrated in (a) of FIG. 10, in the main capacitor bank 111*a* of the CDAC 110, the capacitor Cm<n−1> for which linearity correction has been completed and the capacitors Cm<n−2> to be corrected are connected to the reference voltage VREF_N, and the remaining capacitors Cm (that is, Cm<n−3:0>) and capacitors Cm_unit are connected to the reference voltage VREF_P.

On the other hand, in the auxiliary capacitor bank 111*b*, the capacitors Ca<$n_a$−1> and Ca<$n_a$−2> are connected to the reference voltage VREF_N, and the remaining capacitors Ca (that is, ΣCa<$n_a$−3:0>) are connected to the reference voltage VREF_P. The capacitor Ca<$n_a$−2> supplies the capacitance value assuming there was no variation for the capacitor Cm<n−2>.

Further, the switch SW_VCM is closed and the voltage of each of the capacitors Cm and Ca is forcibly set to the common voltage VCM.

In such a configuration, the sequence of linearity correction for the capacitors Cm<n−2> is initiated. That is, as illustrated in (b) of FIG. 10, first, the switch SW_VCM is opened and also the connection configuration of each of the capacitors Cm and Cm_unit and each capacitor Ca to each of the reference voltages VREF_P and VREF_N is reversed. Thereafter, a search is conducted to change the capacitance value to be complemented for Cm<n−2> by sequentially switching the connection of the capacitors Ca according to the correction designations until the optimal corrected capacitance value α that correctly outputs the desired digital output signal value is specified.

The corrected capacitance value for the capacitor Cm<n−1> (i.e., capacitor Ca<$n_a$−1>+α) (where α=a(n−1)) does not need to be adjusted according to the corrected value for the next bit, capacitor Cm<n−2>, and is independent of the corrected capacitance value α for the other capacitors Cm. The reason is that in the normal mode of operation of the successive-approximation ADC 1, the capacitors Cm corresponding to each bit are used independently of each other, for example, comparison at the n-th bit, comparison at the next bit (n−2 bit) based on the result, comparison at the next bit (bit n−3) based on the result, and so on. In addition, in the linearity correction for the capacitor Cm<n−1>, the total capacitance value of the remaining capacitors Cm (i.e., the capacitance value of ΣCm<n−2:0>), which would likely be to vary, is taken into account and corrected as the capacitor Cm<n−1>, so there is no discrepancy between these values.

FIG. 11 illustrates a circuit connection configuration of CDAC during the linearity correction for the capacitor Cm<n−3> corresponding to the two lower bits of the MSB.

Linearity correction for the capacitor Cm<n−3> corresponding to the two lower bits of MSB (MSB-2) is also performed similarly. The capacitors Cm<n−1:n−2> for which linearity correction has been completed and the corresponding capacitors Ca<$n_a$−1:$n_a$−2> are always fixed to the reference voltage VREF_N side in the linearity correction for the capacitor Cm<n−3>.

First, as illustrated in (a) of FIG. 11, in the main capacitor bank 111*a* of the CDAC 110, the capacitors Cm<n−1:n−2> for which linearity correction has been completed and the capacitors Cm<n−3> to be corrected are connected to the reference voltage VREF_N, and the remaining capacitors Cm (that is, Cm<n−4:0>) and capacitors Cm_unit are connected to the reference voltage VREF_P.

On the other hand, in the auxiliary capacitor bank 111*b*, the capacitors Ca<$n_a$−1:$n_a$−3> are connected to the reference voltage VREF_N, and the remaining capacitors Ca (that is, ¿Ca<$n_a$−4:0>) are connected to the reference voltage VREF_P. The capacitor Ca<$n_a$−3> supplies the corrected capacitance value α to the capacitor Cm<n−3>.

In addition, the switch SW_VCM is closed and the capacitance redistribution signal VC is forcibly set to the common voltage VCM.

In such a state, the sequence of linearity correction for the capacitors Cm<n−3> is initiated. That is, as illustrated in (b) of FIG. 10, first, the switch SW_VCM is opened and also the connection configuration of each of the capacitors Cm and Cm_unit and each capacitor Ca to each of the reference voltages VREF_P and VREF_N is reversed. Thereafter, a search is conducted to change the corrected capacitance value α for Cm<n−3> by sequentially switching the connection of the capacitors Ca until the optimal corrected capacitance value α that correctly outputs the desired digital output signal value is specified.

The linearity correction described above is performed for each capacitor Cm of the CDAC 110, for example, up to the capacitor Cm<0> corresponding to LSB. By way of this, the optimal corrected capacitance value α for each capacitor Cm is obtained. The resulting corrected capacitance value α is supplied during capacitance redistribution by the capacitor Cm in normal mode.

(Operation in Normal Mode)

Next, the operation of the successive-approximation ADC 1 in normal mode, for which linearity correction has been completed, is described, illustrating an example of the circuit connection configuration in the CDAC 110. In the operation of the successive-approximation ADC 1 in the normal mode, the correction designation signal D_AUX0/1 for a specific capacitor Cm corresponding to a predetermined bit to be corrected in the corrected capacitance value designation circuit 220 of the ADC control circuit 20 is directly fed back and held in advance as the pre-correction designation signal D_AUX0/1, respectively, and if the next bit becomes the predetermined bit to be corrected, according to the comparison result signal COMP output from the latch circuit 130, one of the pre-correction designation signals D_AUX0/1 for the specific capacitor Cm corresponding to the predetermined bit currently to be corrected is selected to generate the correction designation signals D_AUX0/1.

Figure 12:
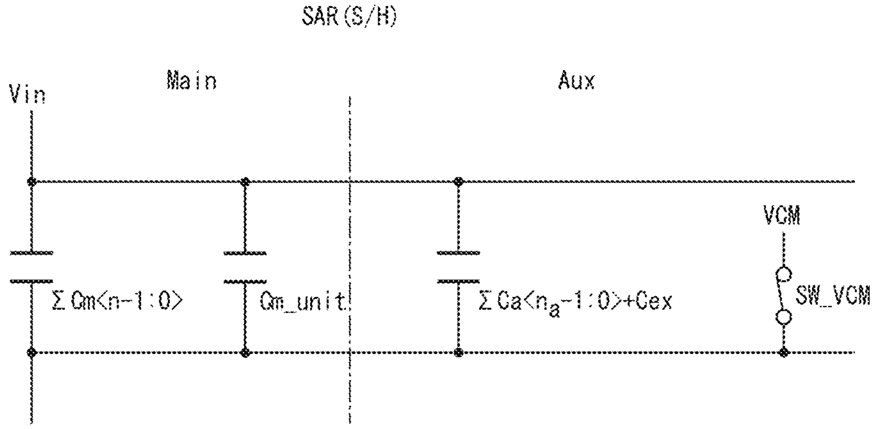
FIG. 12 is a diagram illustrating an example of a capacitor connection configuration in the CDAC in normal mode of the successive-approximation ADC according to the first embodiment of the present invention.

FIG. 12 is a diagram illustrating an example of a capacitor connection configuration in the CDAC in normal mode of the successive-approximation ADC according to the first embodiment of the present invention, and more specifically, illustrates an example of a capacitor connection configuration during sample/hold of the CDAC.

As illustrated in FIG. 12, sample/hold is executed on the CDAC 110 prior to capacitance redistribution by the capacitor Cm. In other words, under the control of the ADC control circuit 20, in the CDAC 110, by the set signal SET, all capacitors Cm in the main capacitor bank 111*a* and all capacitors Ca in the auxiliary capacitor bank 111*b* are connected to the input terminal Vin. At this time, the output voltage of the CDAC 110 is forcibly set to the common voltage VCM by the closure of SW_VCM. As a result, charging is performed on all capacitors Cm and Ca. Thereafter, under the control of the ADC control circuit 20, the CDAC 110 starts capacitance redistribution based on the input analog signal Vin when SW_VCM is opened.

Figure 13:
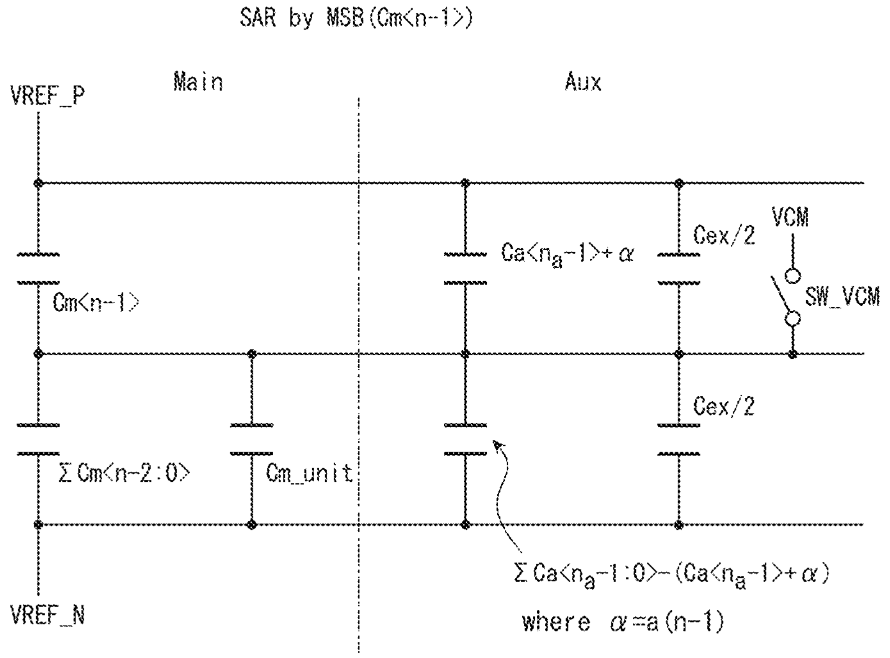
FIG. 13 is a diagram illustrating an example of a capacitor connection configuration in the CDAC in normal mode of the successive-approximation ADC according to the first embodiment of the present invention.

FIG. 13 is a diagram illustrating an example of a capacitor connection configuration in the CDAC in normal mode of the successive-approximation ADC according to the first embodiment of the present invention, and more specifically, illustrates an example of the capacitor connection configuration in the CDAC 110 during capacitance redistribution by the capacitor Cm<n−1> corresponding to MSB.

Specifically, as illustrated in FIG. 13, under the control of ADC control circuit 20, the CDAC 110 connects the capacitor Cm<n−1> of the main capacitor bank 111*a* corresponding to MSB to the reference voltage VREF_P, and connects the capacitor Ca configured to supply the corrected capacitance value of the auxiliary capacitor bank 111*b* (Ca<$n_a$−1>+α) (where α=a(n−1)) to the reference voltage VREF_P. By way of this, a capacitance distributor is formed. At this time, among all capacitors Ca in the auxiliary capacitor bank 111*b*, as a result of linearity correction, the unused capacitors Ca are connected to the reference voltages VREF_P and VREF_N so that the capacitance value Cex due to the connection configuration of the unused capacitor Ca is distributed by half (that is, Cex/2). As a result, the bias in the dynamic range of the successive-approximation ADC 1 is prevented.

The capacitor Cm<n−1> of the CDAC 110 outputs a capacitance redistribution signal VC according to the voltage charged by the input analog signal Vin. Thus, for example, if the voltage of the capacitance redistribution signal VC output from the capacitor Cm<n−1> is less than ½ of the reference voltage VREF, the output of the analog comparator 120 (comparison input signal COMPout) is High, resulting in the MSB being coded "1".

Figure 14:
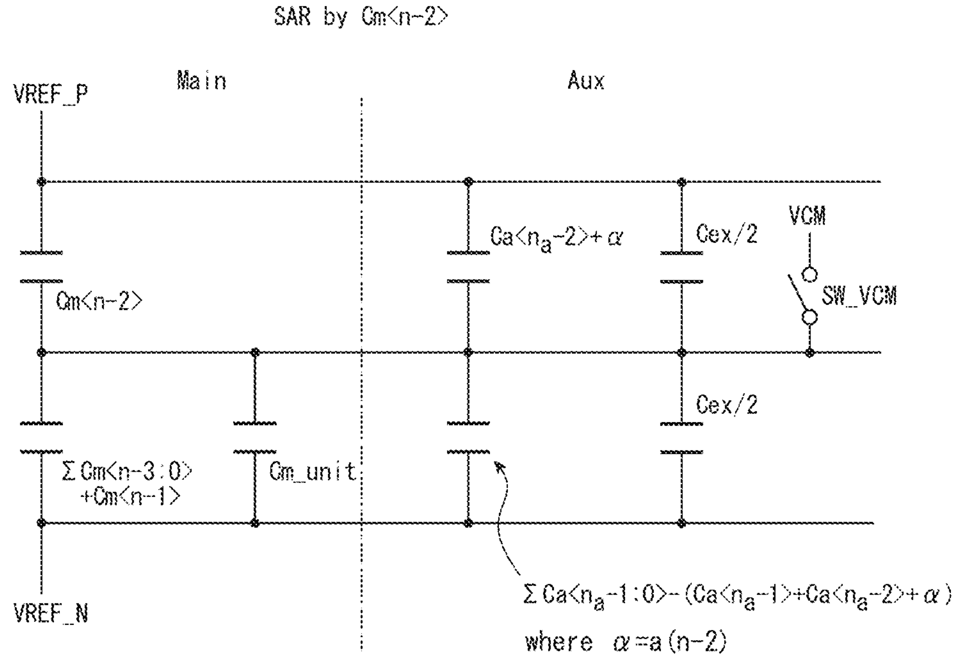
FIG. 14 is a diagram illustrating an example of a capacitor connection configuration in the CDAC in a normal mode of the successive-approximation ADC according to the first embodiment of the present invention.

FIG. 14 is a diagram illustrating an example of a capacitor connection configuration in the CDAC in a normal mode of the successive-approximation ADC according to the first embodiment of the present invention, and more specifically, illustrates an example of the capacitor connection configuration in the CDAC 110 during capacitance redistribution to one lower bit of MSB (MSB-1) by the capacitor Cm<n−2>.

Specifically, as illustrated in FIG. 14, under the control of the ADC control circuit 20, the CDAC 110 connects the capacitors Cm<n−2> and Ca<$n_a$−2>+α (where α=a(n−2) to the reference voltage VREF_P, and connects the capacitor Cm<n−1> and the remaining capacitors Cm<n−3:0>, for which capacitance comparison has already been completed, to the reference voltage VREF_N. Further, under the control of the ADC control circuit 20, the CDAC 110 connects the capacitor Ca<$n_a$−2>+α (where α=a (n−2)) to the reference voltage VREF_P and the remaining capacitor Ca to the reference voltage VREF_N. In this configuration, the capacitor Cm<n−2> of the CDAC 110 outputs the capacitance redistribution signal VC according to the voltage charged by the input analog signal Vin.

Figure 15:
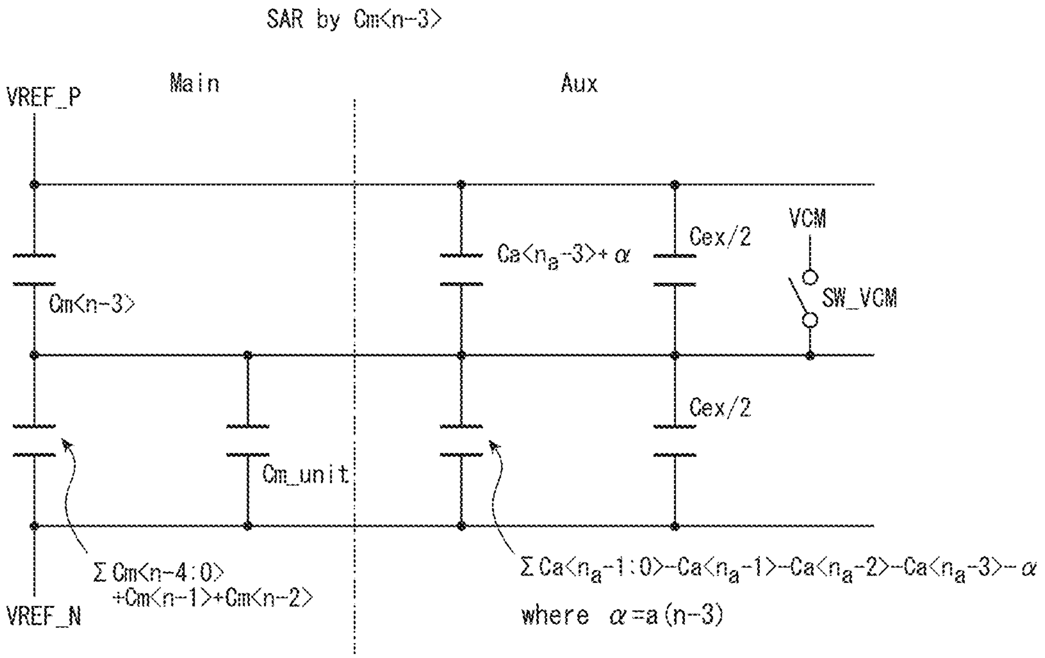
FIG. 15 is a diagram illustrating an example of a capacitor connection configuration in the CDAC in normal mode of the successive-approximation ADC according to the first embodiment of the present invention.

FIG. 15 is a diagram illustrating an example of a capacitor connection configuration in the CDAC in a normal mode of the successive-approximation ADC according to the first embodiment of the present invention, and more specifically, illustrates an example of the capacitor connection configuration in the CDAC 110 during capacitance redistribution to the two lower bits of MSB (MSB-2) by the capacitor Cm<n−3>.

Specifically, as illustrated in FIG. 14, under the control of the ADC control circuit 20, the CDAC 110 connects the capacitors Cm<n−3> and Ca<$n_a$−3>+α (where α=a(n−3) to the reference voltage VREF_P, and connects the capacitors Cm<n−1> and Cm<n−2> for which capacitance comparison has already been completed, and the remaining capacitors Cm<n−4:0> to the reference voltage VREF_N. In addition, under the control of the ADC control circuit 20, the CDAC 110 connects the capacitor Ca<$n_a$−3>+α (where α=a(n−3)) to the reference voltage VREF_P and the remaining capacitor Ca to the reference voltage VREF_N. In this configuration, the capacitor Cm<n−3> of the CDAC 110 outputs the capacitance redistribution signal VC according to the voltage charged by the input analog signal Vin.

In this way, under the control of the ADC control circuit 20, the CDAC 110 connects the capacitor Cm<k> to be corrected to the reference voltage VREF_P, and connects the capacitor Cm other than the capacitors Cm<k> to the reference voltage VREF_N, while connecting the capacitor Ca to either the reference voltage VREF_P or VREF_N, depending on the bit k to be corrected. As a result, the capacitor Cm<k> outputs a capacitance redistribution signal VC according to the voltage charged by the input analog signal Vin.

ADVANTAGES, EFFECTS, OR THE LIKE

As described above, according to the present embodiment, the CDAC 110 redistributes the capacitance by each capacitor Cm from MSB to the capacitor Cm corresponding to any lower bit (e.g., capacitor Cm<0> corresponding to LSB). By way of this, since the optimal corrected capacitance value is supplied for each capacitor Cm, the CDAC 110 redistributes the capacitance of the capacitor Cm more accurately, and outputs the accurate digital output signal D_MAIN as a result.

Among others, according to the present embodiment, offset correction for the analog comparator is performed before linearity correction for the CDAC 110, resulting in more accurate linearity correction.

Further, according to the present embodiment, the correction designation signal D_AUX0/1 for a specific capacitor Cm corresponding to a predetermined bit to be corrected in the corrected capacitance value designation circuit 220 of the ADC control circuit 20 is directly fed back and held in advance as the pre-correction designation signal D_AUX0/1, respectively, and if the next bit is a predetermined bit to be corrected, as the correction designation signal D_AUX0/1 is generated by selecting one of the pre-correction designation signals D_AUX0/1 for the specific capacitor Cm corresponding to the predetermined bit to be corrected now, according to the comparison result signal COMP output from the latch circuit 130, the increase in the size of the circuit configuration of the successive-approximation ADC 1 is suppressed and the operating speed is prevented from decreasing.

Further, according to the present embodiment, as the correction designation signal D_AUX0/1 of the next bit is computed by using the pre-correction designation signal D_AUX0/1, which is two-wired for the correction designation signal D_AUX0/1 in the corrected capacitance value designation circuit 220 and directly fed back to the correction designation signal D_AUX0/1, compared to the related art, critical computation timing may not be required, and the computation timing margin is increased, allowing the operating frequency of the successive-approximation ADC 1 to be further improved.

Second Embodiment

The present embodiment, which is a modification of the above embodiment, may be characterized in that the correction designation values of the x^2 patterns up to p bits (where p is an integer of 2 or more) are held in advance, and one of the correction designation values of the p^2 patterns is selected based on the result of the comparison result signal COMP to generate the recent correction designation value. In the following, the correction designation values for the four patterns up to 2 bits (that is, p=2) before are described as being held in advance.

Figure 16:
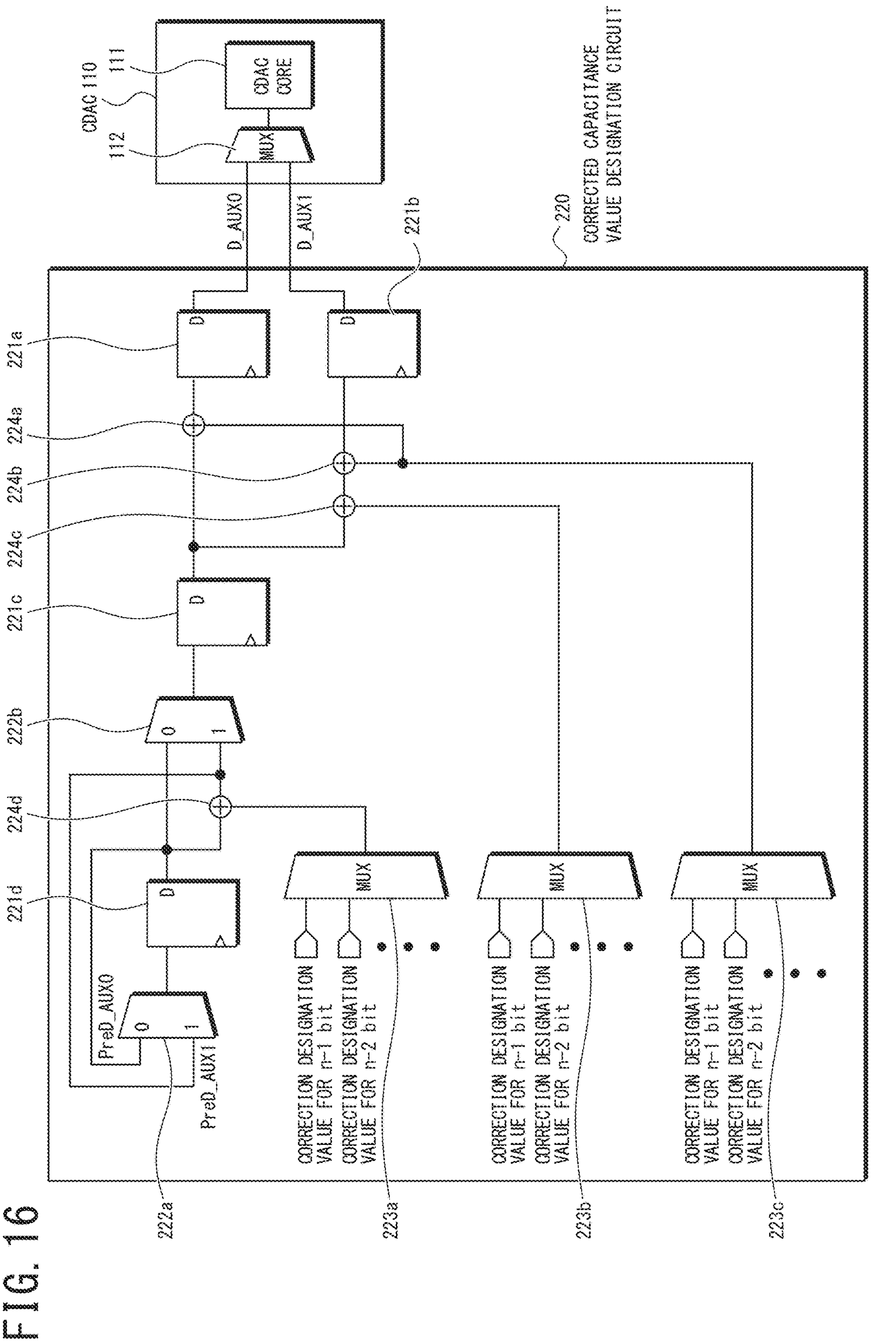
FIG. 16 is a diagram illustrating an example of a configuration of a corrected capacitance value designation circuit in a successive-approximation ADC according to a second embodiment of the present invention.

FIG. 16 is a diagram illustrating an example of a configuration of a corrected capacitance value designation circuit in a successive-approximation ADC according to a second embodiment of the present invention. As illustrated in FIG. 16, the corrected capacitance value designation circuit 220 in the present embodiment differs from the one illustrated in FIG. 4 in that, in outline, the corrected capacitance value designation circuit 220 consists of four flip-flops 221*a*-221*d* for holding the pre-correction designation signal D_AUX0/1 and two multiplexers 222*a*, 222*b* accordingly. In FIG. 16, the same reference numerals are attached to the same components illustrated in FIG. 4. The configuration of the flip-flop 221 illustrated in FIG. 16 is an example, and the configuration thereof may be changed suitably, depending on the logic design based on the initial values to be held.

According to the present embodiment, the same advantages and effects as those of the above-described embodiment may be obtained. In particular, according to the present embodiment, the successive-approximation ADC 1 is able to hold the correction designation value 2 bits earlier in advance, which allows for further speed-up.

Each of the embodiments described above is an illustration for describing the present invention, and the present invention is not intended to be limited only to these embodiments. The present invention may be implemented in various forms without departing from the gist thereof.

For example, in any method disclosed in the present specification, steps, actions or functions may be performed in parallel or in a different order unless the results are consistent. The steps, operations, and functions described above are provided as mere examples, and some of the steps, operations, and functions may be omitted within departing from the gist of the invention, or may be combined into a single unit, or other steps, operations, or functions may be added.

Further, the functionality of the elements disclosed herein may be implemented using circuitry or processing circuitry which includes general purpose processors, special purpose processors, integrated circuits, ASICS ("Application Specific Integrated Circuits"), conventional circuitry and/or combinations thereof which are configured or programmed to perform the disclosed functionality. Processors are considered processing circuitry or circuitry as they include transistors and other circuitry therein. In the disclosure, the circuitry, units, or means are hardware that carry out or are programmed to perform the recited functionality. The hardware may be any hardware disclosed herein or otherwise known which is programmed or configured to carry out the recited functionality. When the hardware is a processor which may be considered a type of circuitry, the circuitry, means, or units are a combination of hardware and software, the software being used to configure the hardware and/or processor.

In addition, in the present specification, while various embodiments are disclosed, certain features (technical matters) in one embodiment may be added to or replaced with certain features in other embodiments, with improvements suitably, and such forms are also included in the gist of the present invention.

REFERENCE SIGNS LIST

1: successive-approximation ADC
10: ADC body circuit
110: CDAC
111: CDAC core
111*a*: main capacitor bank
111*b*: auxiliary capacitor bank
112: multiplexer
120: analog comparator
130: latch circuit
140: logic circuit
150: offset correction circuit
20: ADC control circuit
210: selector
220: corrected capacitance value designation circuit
221: flip-flop
222: multiplexer
223: multiplexer
224: multiplexer
225: adder
230: state machine
240: offset correction control circuit
30: system control circuit

The invention claimed is:

1. A successive-approximation analog-to-digital converter using a capacitance redistribution method, the converter comprising:
- an ADC control circuit; and
- an ADC body circuit configured to, under control of the ADC control circuit, convert an analog input signal into a digital output signal and output the digital output signal,
- wherein the ADC body circuit includes
  - a CDAC that includes a main capacitor bank composed of a plurality of first capacitors connected in parallel and an auxiliary capacitor bank composed of a plurality of second capacitors connected in parallel, the auxiliary capacitor bank being connected to supply a corrected capacitance value for any of the plurality of first capacitors in the main capacitor bank,
  - a comparator configured to output a bit signal based on a capacitance redistribution signal output according to capacitance redistribution by the CDAC in response to the analog input signal,
  - a logic circuit configured to output the digital output signal in a predetermined format based on the bit signal output from the comparator, and
  - a corrected capacitance value designation circuit configured to output a correction designation value to designate a corrected capacitance value to be supplied to the first capacitors in the main capacitor bank, wherein
- the corrected capacitance value designation circuit holds in advance at least two correction designation values at least one bit earlier in time as pre-correction designation values, selects one of the pre-correction designation values according to the bit signal fed back from the comparator, and calculates at least two latest correction designation values based on one of the selected pre-correction designation values.

2. The successive-approximation analog-to-digital converter according to claim 1,
- wherein the CDAC controls the corrected capacitance value to be supplied to the first capacitors based on one of the two correction designation values.

3. The successive-approximation analog-to-digital converter according to claim 2,
- wherein the ADC body circuit selects one of the two correction designation values according to the bit signal fed back from the comparator.

4. The successive-approximation analog-to-digital converter according to claim 2, wherein the CDAC controls a connection configuration of the second capacitor to supply the corrected capacitance value to the first capacitors based on one of the two correction designation values.

5. The successive-approximation analog-to-digital converter according to claim 1, further comprising:

an offset correction control circuit configured to control execution of offset correction for the comparator; and an offset correction circuit configured to, under control of the offset correction control circuit, supply an offset corrected value to the comparator.

6. The successive-approximation analog-to-digital converter according to claim 5, wherein the offset correction control circuit controls the offset correction circuit to increase or decrease an output current value for the comparator, and specifies the output current value, as the offset corrected value, at a point in time when the bit signal output from the comparator is changed by the increase or decrease of the output current value.

7. The successive-approximation analog-to-digital converter according to claim 6, wherein the comparator includes an analog comparator that outputs a comparison result signal based on the capacitance redistribution signal, and a latch circuit that outputs the bit signal based on the comparison result signal output from the analog comparator.

8. The successive-approximation analog-to-digital converter according to claim 7, wherein the offset correction circuit supplies the offset corrected value for the comparison result signal.

9. The successive-approximation analog-to-digital converter according to claim 1, wherein the ADC control circuit controls the ADC body circuit to operate in one of correction mode and normal mode, and wherein the ADC control circuit, in the correction mode, specifies the corrected capacitance value to be supplied from the auxiliary capacitor bank to a first capacitor to be corrected based on the bit signal output from the comparator by executing linearity correction for the CDAC to output a target digital output signal based on the first capacitor to be corrected corresponding to a predetermined bit, and in the normal mode, supplies the specified corrected capacitance value from some of the second capacitors to the first capacitor to be corrected according to the correction designation value based on the bit signal output from the comparator.

10. The successive-approximation analog-to-digital converter according to claim 9, wherein the ADC control circuit increases or decreases a capacitance value supplied from the auxiliary capacitor bank by changing the correction designation value in a stepwise or gradual manner, and specifies the capacitance value, as the corrected capacitance value for the first capacitor to be corrected, at a point in time when the bit signal output from the comparator changes.

11. The successive-approximation analog-to-digital converter according to claim 10, wherein the CDAC supplies the capacitance value based on some of the plurality of second capacitors to the first capacitor to be corrected, according to the correction designation value.

12. The successive-approximation analog-to-digital converter according to claim 11, wherein the ADC control circuit connects the first capacitor to be corrected to a first reference voltage and connects the first capacitors other than the first capacitor to be corrected to a second reference voltage, and controls the CDAC to supply the capacitance value based on some of the plurality of second capacitors connected to the first reference voltage to the first capacitor to be corrected.

13. The successive-approximation analog-to-digital converter according to claim 12, wherein the ADC control circuit controls a connection configuration of the second capacitor so that, in the normal mode, a capacitance value of the second capacitor that has not been used for supplying the specified corrected capacitance value to the first capacitor to be corrected is distributed to each of the first reference voltage and the second reference voltage.

14. The successive-approximation analog-to-digital converter according to claim 9, wherein in the correction mode, the ADC control circuit executes offset correction for the comparator and then executes the linearity correction.

15. The successive-approximation analog-to-digital converter according to claim 1, wherein the auxiliary capacitor bank includes a split capacitor for dividing the plurality of second capacitors into predetermined upper bits and predetermined lower bits.

16. The successive-approximation analog-to-digital converter according to claim 1, wherein the corrected capacitance value designation circuit is configured to hold p^2 correction designation values (where p is an integer of two or more) before p bits as pre-correction designation values, and one of two pre-correction designation values before one bit is selected as the recent correction designation value based on the bit signal.

17. A method for operating a successive-approximation analog-to-digital converter that converts an input analog input signal into a digital output signal and outputs the converted signal, the method comprising:

outputting a capacitance redistribution signal in response to the analog input signal according to capacitance redistribution by a CDAC;

outputting a bit signal by a comparator in response to the capacitance redistribution signal; and outputting the digital output signal in a predetermined format based on the bit signal, wherein the outputting the capacitance redistribution signal includes outputting a correction designation value that designates a corrected capacitance value to be supplied to a plurality of first capacitors connected in parallel in a main capacitor bank of the CDAC, and performing control to supply the corrected capacitance value designated by the correction designation value for any of the plurality of first capacitors from a plurality of second capacitors connected in parallel in an auxiliary capacitor bank of the CDAC, and wherein outputting the correction designation value includes holding in advance at least two correction designation values at least one bit earlier in time as pre-correction designation values, selecting one of the pre-correction designation values according to the bit signal fed back from the comparator, and calculating two most recent correction designation values based on one of the selected pre-correction designation values.

18. The method for operating a successive-approximation analog-to-digital converter according to claim 17, the method further comprising:

executing linearity correction to specify the corrected capacitance value to be supplied from the auxiliary capacitor bank to a first capacitor to be corrected based on the bit signal output from the comparator so that a target digital output signal is output based on the first capacitor to be corrected corresponding to a predetermined bit.

19. The method for operating a successive-approximation analog-to-digital converter according to claim 18, wherein the executing the linearity correction includes increasing or decreasing the capacitance value supplied by the auxiliary capacitor bank by changing the correction designation value in a stepwise or gradual manner, and specifying the capacitance value at a point in time when the bit signal output from the comparator changes in response to an increase or a decrease in the capacitance value as the corrected capacitance value for the first capacitor to be corrected.

* * * * *